(12) United States Patent
Nakamura et al.

(10) Patent No.: US 10,123,443 B2
(45) Date of Patent: Nov. 6, 2018

(54) SEMICONDUCTOR DEVICE

(71) Applicant: Fuji Electric Co., Ltd., Kanagawa (JP)

(72) Inventors: Hideyo Nakamura, Nagano (JP); Ryuji Yamada, Tokyo (JP); Hiromu Takubo, Tokyo (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 6 days.

(21) Appl. No.: 14/930,565

(22) Filed: Nov. 2, 2015

(65) Prior Publication Data

US 2016/0192495 A1 Jun. 30, 2016

(30) Foreign Application Priority Data

Dec. 25, 2014 (JP) .................................. 2014-263278
May 29, 2015 (JP) .................................. 2015-110447

(51) Int. Cl.
*H02M 7/00* (2006.01)
*H05K 1/02* (2006.01)
(Continued)

(52) U.S. Cl.
CPC ....... *H05K 7/1427* (2013.01); *H01L 23/3735* (2013.01); *H01L 23/49811* (2013.01); *H01L 23/5227* (2013.01); *H01L 23/5385* (2013.01); *H05K 1/0265* (2013.01); *H05K 1/145* (2013.01); *H05K 7/1432* (2013.01);
(Continued)

(58) Field of Classification Search
CPC .... H05K 7/1427; H05K 1/0265; H05K 1/145; H05K 7/1432; H05K 2201/10166; H05K 2201/10295; H01L 23/3735; H01L 23/49811; H01L 23/5227; H01L 23/5385;
(Continued)

(56) References Cited

U.S. PATENT DOCUMENTS

2010/0127277 A1* 5/2010 Arai .................... H01L 21/8213
257/77
2012/0119256 A1* 5/2012 Okita .................... H01L 25/072
257/140
(Continued)

FOREIGN PATENT DOCUMENTS

JP 2012-110095 A 6/2012
JP 5446541 B2 3/2014
(Continued)

*Primary Examiner* — Michael P McFadden
(74) *Attorney, Agent, or Firm* — Chen Yoshimura LLP

(57) ABSTRACT

A semiconductor device including: a plurality of semiconductor units each constituting a three-level inverter circuit; and a connection unit electrically connecting the plurality of semiconductor units in parallel, wherein each of the semiconductor units includes: a multi-layer substrate including an insulating plate and circuit plates disposed on a primary surface of the insulating plate; a plurality of semiconductor elements each having a back surface thereof fixed to one of the circuit plates and a front surface thereof having primary electrodes; and wiring members electrically connected to the primary electrodes of the semiconductor elements, and wherein in each of the semiconductor units, the multi-layer substrate, the plurality of semiconductor elements, and the wiring members are configured in such a way as to constitute the three-level inverter circuit.

11 Claims, 19 Drawing Sheets

(51) Int. Cl.
*H05K 1/14* (2006.01)
*H05K 7/14* (2006.01)
*H01L 23/522* (2006.01)
*H01L 23/373* (2006.01)
*H01L 23/498* (2006.01)
*H01L 23/538* (2006.01)
*H02M 7/487* (2007.01)

(52) U.S. Cl.
CPC .............. *H01L 2224/0603* (2013.01); *H01L 2924/0002* (2013.01); *H02M 7/003* (2013.01); *H02M 7/487* (2013.01); *H05K 2201/10166* (2013.01); *H05K 2201/10295* (2013.01)

(58) Field of Classification Search
CPC .... H01L 2224/0603; H01L 2924/0002; H02M 7/003; H02M 7/487

USPC ........................................................ 361/783
See application file for complete search history.

(56) References Cited

U.S. PATENT DOCUMENTS

2012/0241953 A1* 9/2012 Yamada ............. H01L 23/4334
257/737
2014/0218991 A1 8/2014 Chen et al.
2016/0329834 A1* 11/2016 Sugiyama ............. H02M 7/487

FOREIGN PATENT DOCUMENTS

JP 5488244 B2 5/2014
JP 2014-155287 A 8/2014

* cited by examiner

|  | Upper and Lower Arms ||  Middle Arm |
|---|---|---|---|
|  | IGBT | FWD | Reverse-blocking IGBT |
| Conduction Losses | 41% | 1% | 23% |
| Switching Losses | 28% | 1% | 6% |
| Total | 69% | 2% | 29% |
| Total Sum of Losses in All Arms | 100% |||

FIG. 11A

|  | Upper and Lower Arms ||  Middle Arm |
|---|---|---|---|
|  | IGBT | FWD | Reverse-blocking IGBT |
| Conduction Losses | ≒0% | 40% | 20% |
| Switching Losses | ≒0% | 14% | 26% |
| Total | ≒0% | 54% | 46% |
| Total Sum of Losses in All Arms | 100% |||

FIG. 11B

|  | Upper and Lower Arms | | Middle Arm |
| --- | --- | --- | --- |
|  | IGBT | FWD | Reverse-blocking IGBT |
| Conduction Losses | 21% | 1% | 43% |
| Switching Losses | 28% | 1% | 6% |
| Total | 49% | 2% | 49% |
| Total Sum of Losses in All Arms | 100% | | |

FIG. 11C

SEMICONDUCTOR DEVICE

BACKGROUND OF THE INVENTION

Technical Field

The present invention relates to a semiconductor device.

Background Art

A semiconductor device called a power semiconductor module includes a semiconductor chip, on which semiconductor elements such as IGBTs (Insulated Gate Bipolar Transistor) or FWDs (Free Wheeling Diode) are formed, and is widely used as a power converter.

In recent years, a power semiconductor module equipped with a three-level inverter circuit is being used in fields that seek to improve technologies such as wind power generation and solar power generation (refer to Patent Document 1, for example).

RELATED ART DOCUMENT

Patent Document

Patent Document 1: Japanese Patent Application Laid-Open Publication No. 2012-110095

SUMMARY OF THE INVENTION

In the power semiconductor module described in Patent Document 1, when a voltage is applied from a connection terminal, a current flows through elements in the module and a conductive layer for wiring and exits from another connection terminal. Although the amount of current that flows out in this way is large, because the current path between where the current goes in and out is long, restraining the inductance of the wiring is difficult.

Also, a multi-layer substrate requires a conductive layer for wiring in addition to the conductive layer used for mounting elements. For this reason, to allow for a larger amount of current, increasing the surface area of the multi-layer substrate becomes necessary. Thus, increasing the size of the power semiconductor module is unavoidable. Furthermore, because the current path would be longer in a larger module, restraining the inductance of the wiring becomes even more difficult.

The present invention was made in view of such issues and aims at providing a semiconductor device with a larger current-carrying capacity while reducing the inductance of the wiring. Accordingly, the present invention is directed to a semiconductor device that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides: a semiconductor device including: a plurality of semiconductor units each constituting a three-level inverter circuit; and a connection unit electrically connecting the plurality of semiconductor units in parallel, wherein each of the semiconductor units includes: a multi-layer substrate including an insulating plate and circuit plates disposed on a primary surface of the insulating plate; a plurality of semiconductor elements each having a back surface thereof fixed to one of the circuit plates and a front surface thereof having primary electrodes; and wiring members electrically connected to the primary electrodes of the semiconductor elements, and wherein in each of the semiconductor units, the multi-layer substrate, the plurality of semiconductor elements, and the wiring members are configured in such a way as to constitute the three-level inverter circuit.

Using the technology disclosed here, the inductance of the wiring can be reduced while increasing the current-carrying capacity. It is to be understood that both the foregoing general description and the following detailed description are exemplary and explanatory, and are intended to provide further explanation of the invention as claimed.

BRIEF DESCRIPTION OF THE DRAWINGS

FIGS. 11A to 11C are tables respectively showing the losses that occur in each semiconductor chip in a power conversion system.

DETAILED DESCRIPTION OF EMBODIMENTS

Below, the embodiments are described with reference to the figures.

Embodiment 1

Figure 1A:
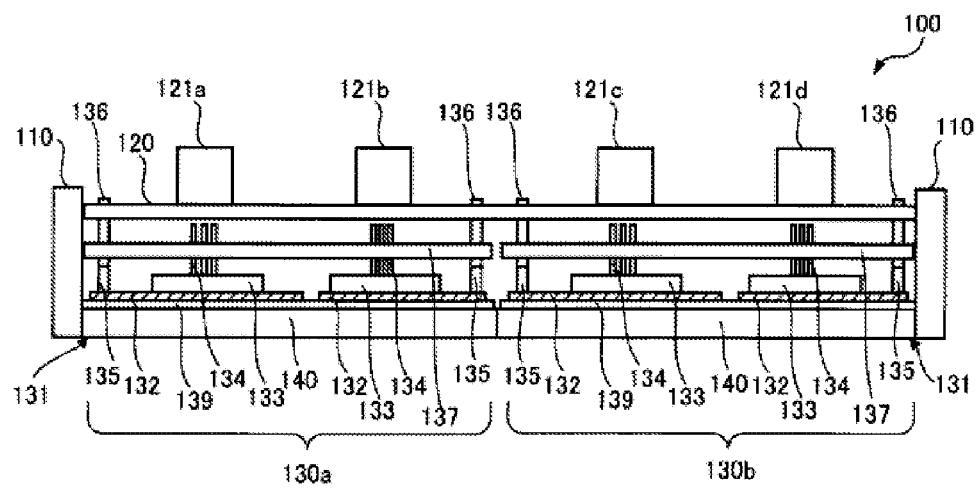
FIGS. 1A and 1B are views used to describe a semiconductor device according to Embodiment 1.
Figure 1B:
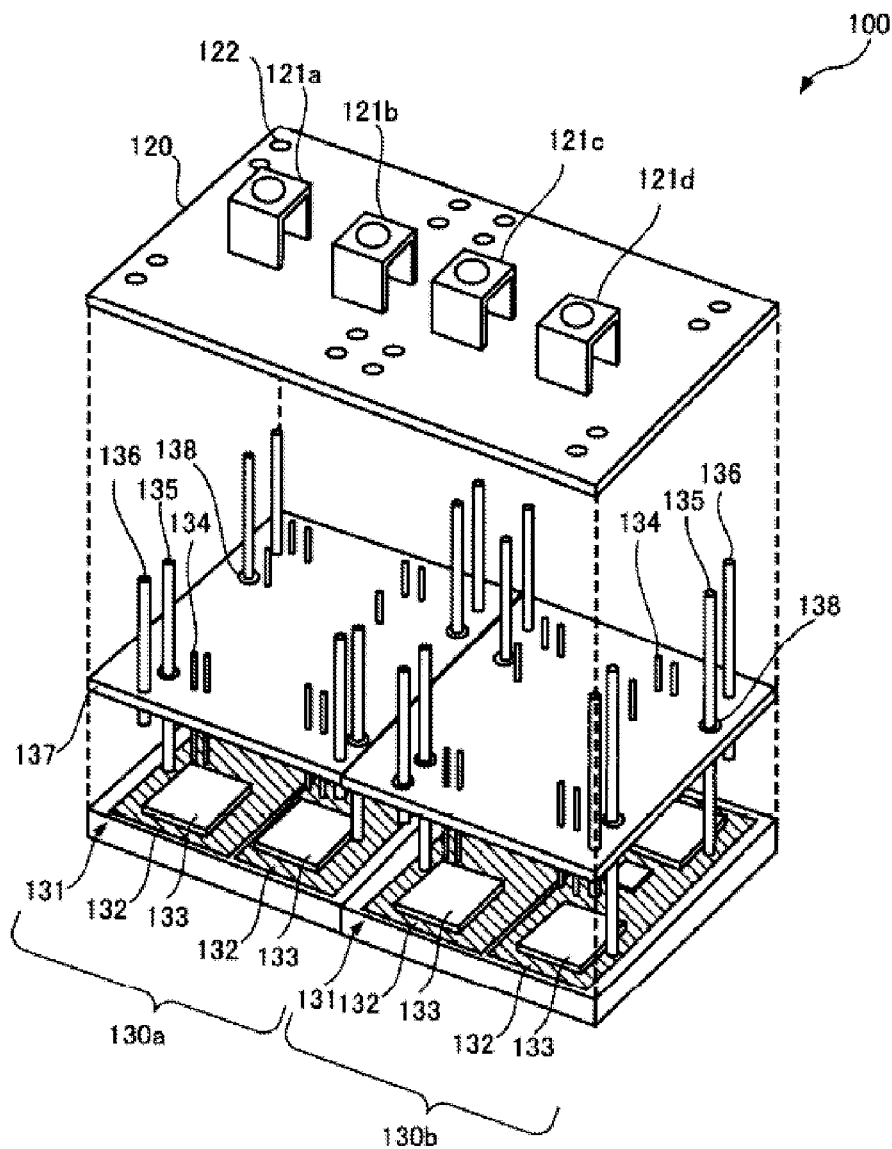

FIGS. 1A and 1B are views used to describe a semiconductor device according to Embodiment 1. FIG. 1A is a cross-sectional view of a semiconductor device. FIG. 1B is an exploded perspective view of the semiconductor device. In FIG. 1B, a case is not shown. As shown in FIGS. 1A and 1B, a semiconductor device 100 equipped with a three-level inverter circuit includes a plurality (two) of semiconductor units 130a and 130b and a connection unit 120 electrically connecting the semiconductor units 130a and 130b in parallel. The semiconductor device 100 further includes a case 110.

Embodiment 1 describes an example in which a printed circuit board is used for the connection unit 120. The connection unit 120 is formed by stacking a plurality of circuit layers (not shown) inside. On the connection unit 120, there are external terminals 121a to 121d connected to respective circuit layers. The external terminals 121a to 121d correspond respectively to a P terminal, an M terminal, an N terminal, and a U terminal of a three-level inverter.

The semiconductor units 130a and 130b are arranged next to one another on the same plane, and the connection unit 120 is arranged as to cover the semiconductor units. Primary terminals (primary terminal posts) 135 and control terminals 136 of each of the semiconductor units 130a and 130b are inserted into connection holes 122 in the connection unit 120. As a result, the primary terminals 135, the control terminals 136, and the connection unit 120 become electrically connected. Each of the primary terminals 135 is electrically connected to the respective external terminals 121a to 121d via the respective circuit layers of the connection unit 120. As a result, the semiconductor units 130a and 130b become electrically connected in parallel.

Each of the semiconductor units 130a and 130b includes a multi-layer substrate 131, a plurality of semiconductor elements 133, and wiring members including a printed circuit board 137 and a plurality of conductive posts 134. Each of the semiconductor units 130a and 130b further includes the primary terminals 135 and the control terminals 136.

The multi-layer substrate 131 includes an insulating plate 139 and circuit plates 132. The circuit plates 132 are disposed on the primary surface (the top surface in the figure) of the insulating plate 139. The multi-layer substrate 131 also includes a metal plate 140 on the surface of the insulating plate 139 opposite to the primary surface thereof. The circuit plates 132 are made by forming a conductive layer into a prescribed shape. One end of each of the primary terminals 135 is fixed on the circuit plate 132. For the multi-layer substrate 131, a DCB (direct copper bonding) substrate or AMB (active metal blazed) substrate can be used, for example.

The semiconductor elements 133 are switching elements such as IGBTs or power MOSFETs (metal oxide semiconductor field effect transistors), for example. The back surface of each of the semiconductor elements 133 is fixed to the circuit plates 132 by a bonding material such as solder, and the front surface includes primary electrodes such as emitter electrodes. When the semiconductor elements 133 are vertical IGBTs, each front surface further includes a gate electrode and each back surface further includes a collector electrode. The collector electrode on the back surface is also electrically connected to the circuit plates 132. In addition to the semiconductor elements 133, which are switching elements, the semiconductor device 100 includes diodes such as SBDs (schottky barrier diodes) and FWDs (not shown in the figures).

The printed circuit board 137 is disposed to face the primary surface of the insulating plate 139 of the multi-layer substrate 131. The circuit layers (not shown in the figure), on which prescribed wiring structures are formed, are equipped on the surface of or inside the printed circuit board 137.

Each of the conductive posts 134 is made of a cylindrical conductor and electrically connects the primary electrodes on the front surface of each of the semiconductor elements 133 to the circuit layers of the printed circuit board 137. Some of the conductive posts 134 are inserted into and fixed to the printed circuit board 137. Other conductive posts 134 electrically connect the circuit plates 132 of the multi-layer substrate 131 to the circuit layers of the printed circuit board 137. As such, wiring members including the printed circuit board 137 and the plurality of conductive posts 134 are used to electrically connect each of the primary electrodes of the semiconductor elements 133 to the circuit plates 132 and the like.

One end of the primary terminal 135 made of a cylindrical conductor is fixed to the circuit plates 132 with a conductive bonding material such as solder. The other end of the primary terminal 135 protrudes in one direction (the upward direction in the figure) through a through-hole 138 in the printed circuit board 137. The primary terminal 135 is also electrically connected to the primary electrodes of each semiconductor element 133 via the circuit layers of the printed circuit board 137, the conductive posts 134, and the circuit plates 132. Another primary terminal 135 is also electrically connected to a collector electrode on the back surface of each semiconductor element 133. The primary terminals 135 input power from the connection unit 120 into one of the semiconductor elements 133 and output power from one of the semiconductor elements 133 into the connection unit 120.

The control terminals 136 made of a cylindrical conductor are inserted into and fixed to the printed circuit board 137 and protrude in the same direction as the primary terminals 135 (upward direction in the figure). Furthermore, the control terminals 136 are electrically connected to gate electrodes of the semiconductor elements 133 via the circuit layers of the printed circuit board 137 and the conductive posts 134. In accordance with an external control signal, the control terminals 136 apply gate voltages to the gate electrodes of the semiconductor elements 133 via the circuit layers of the printed circuit board 137 and the conductive posts 134.

Inside each of the semiconductor units 130a and 130b, a three-level inverter circuit is formed by the multi-layer substrate 131 including the circuit plates 132, the plurality of semiconductor elements 133, the printed circuit board 137 having the circuit layers, and the plurality of conductive posts 134.

In the semiconductor device 100, when a voltage is applied by connecting an external power supply to the external terminals 121a to 121c, an input voltage is applied via the connection unit 120 to the primary terminal 135 of each of the semiconductor units 130a and 130b, which are connected in parallel. Gate voltages are also applied to the control terminals 136 of each of the semiconductor units 130a and 130b. In each of the semiconductor units 130a and 130b, an input voltage is applied to a collector electrode on the back surface of each of the semiconductor elements 133 from one of the primary terminals 135 via the circuit plates 132. Gate voltages are also applied to the gate electrodes on the front surface of each of the semiconductor elements 133 from the control terminals 136 via the printed circuit board 137 and the conductive post 134. As described earlier, because each of the semiconductor units 130a and 130b has a three-level inverter circuit, the semiconductor device 100 functions as a three-level inverter module with rated current twice that of each of the semiconductor units 130a and 130b.

Compared to the conventional technology, this configuration can significantly lower the inductance of the wiring in the semiconductor device 100. This is because connecting the semiconductor unit 130a and the semiconductor unit 130b in parallel cuts the overall inductance of the semiconductor units 130a and 130b to half of that for a single semiconductor unit. Thus, even if the inductance of the connection unit 120, which connects the semiconductor units in parallel, is included, the inductance inside the device can be lowered significantly compared to the conventional technology. Additionally, because each of the semiconductor units 130a and 130b according to Embodiment 1 uses the printed circuit board 137 and the plurality of conductive posts 134, the inductance of each of the semiconductor units 130a and 130b becomes less than the conventional wire bonding method, as the wiring becomes thicker and shorter.

Furthermore, due to the diligent research by the inventors of the present invention, it became clear that lowering the inductance of the wiring between the P terminal and the M terminal and between the M terminal and the N terminal of a three-level inverter circuit is effective for improving the efficiency of a three-level inverter module.

In Embodiment 1, in each of the semiconductor units 130a and 130b, the printed circuit board 137 and the plurality of conductive posts 134 are used as electrical wiring. For this reason, it was possible to lower the inductance among the four semiconductor elements 133 in each of the semiconductor units 130a and 130b and to improve the efficiency of the three-level inverter circuit.

Furthermore, by using the printed circuit board 137 and the plurality of conductive posts 134 as electrical wiring, a conductive layer for wiring on the multi-layer substrate 131 used in the conventional technology becomes unnecessary. This makes it possible to make each of the semiconductor units 130a and 130b smaller. As a result, the semiconductor device 100 can both be made smaller and allow for a larger volume of current.

Moreover, the inductance between each semiconductor unit and each external terminal can be lowered by directly placing the external terminals 121a to 121d of the semiconductor device 100 on the connection unit 120. This arrangement makes it possible to provide a more efficient three-level inverter module. In Embodiment 1, the connection unit 120 is not limited to a printed circuit board, even though an example using a printed circuit board as the connection unit 120 was provided. A bus bar, lead frame, or the like may also be used for a connection unit, for example. In a situation such as when the number of terminals on semiconductor units needed to be connected is large, using a printed circuit board as a connection unit can make it possible not only to deal with complex wiring but also to handle changes in circuit design and shape arising when manufacturing many different kinds of devices in small quantities. Furthermore, if a bus bar or lead frame is used for the connection unit 120, the cost of parts in high-volume production can be lowered.

Embodiment 2

Figure 2A:
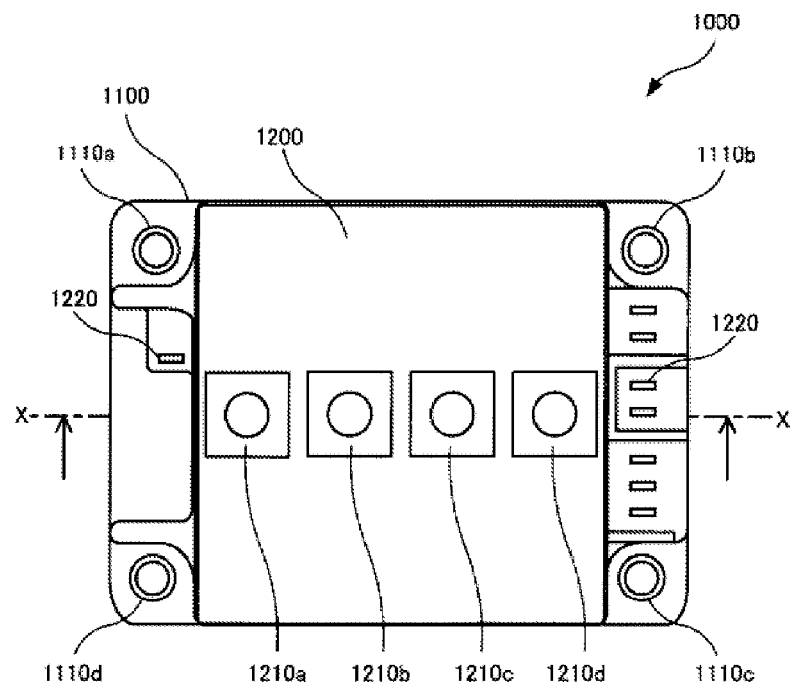
FIGS. 2A and 2B are views showing a semiconductor device according to Embodiment 2.
Figure 2B:
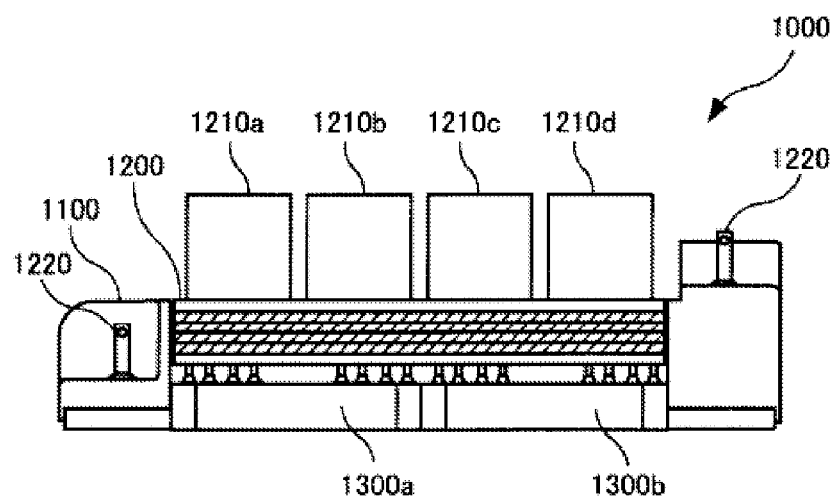

A semiconductor device according to Embodiment 2 is described using FIGS. 2A to 8. FIGS. 2A and 2B are views showing a semiconductor device according to Embodiment 2. FIG. 2A is a top view of a semiconductor device, and FIG. 2B is a cross-sectional view of FIG. 2A along one-dot-chain line X-X.

Figure 3:
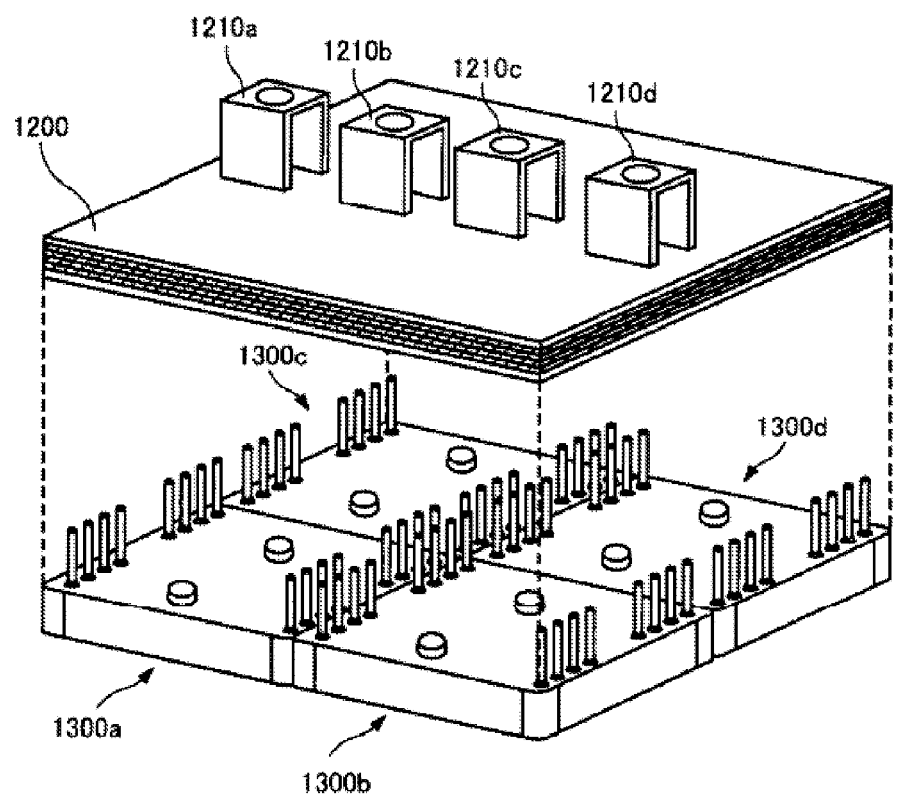
FIG. 3 is a perspective view showing semiconductor units and a connection unit equipped in a semiconductor device according to Embodiment 2.

FIG. 3 is a perspective view showing semiconductor units and a connection unit equipped in a semiconductor device according to Embodiment 2. In FIG. 3, a case is not shown. A semiconductor device 1000 includes four semiconductor units 1300a to 1300d and a connection unit 1200 that electrically connects each of the semiconductor units 1300a to 1300d in parallel. Furthermore, the semiconductor device 1000 includes a case 1100 that houses the semiconductor units 1300a to 1300d.

In the central region, the case 1100 can house the semiconductor units 1300a to 1300d in two rows and two columns. Although an example in which the four semiconductor units 1300a-1300d are housed in two rows and two columns is used to describe Embodiment 2, the number of semiconductor units housed and the way the semiconductor units are arranged are not limited to this example. Screw holes 1100a to 1100d, which would be used when placing the semiconductor device 1000 in a prescribed location, are provided on the four corners of the case 1100.

Embodiment 2 describes an example in which a printed circuit board is used for the connection unit 1200. Four external terminals 1210a to 1210d corresponding respectively to a P terminal, an M terminal, an N terminal, and a U terminal of a three-level inverter module are provided on the connection unit 1200. Inside the connection unit 1200, four circuit layers, each of which is connected electrically to terminals such as the external terminals 1210a to 1210d, are stacked (not shown in the figure). Further inside the connection unit 1200, additional circuit layers (not shown in the figure) connecting to control terminals are also stacked. Furthermore, the connection unit 1200 has connection holes (not shown) to which primary terminals and control terminals (described later) of each of the semiconductor units 1300a to 1300d connect.

As shown in FIG. 3, the four semiconductor units 1300a to 1300d are disposed next to one another on the same plane, and the connection unit 1200 is disposed as to cover the four semiconductor units. The primary terminals and the control terminals of each of the semiconductor units 1300a to 1300d are inserted into the connection holes of the connection unit 1200. The primary terminals of each of the semiconductor units 1300a to 1300d are electrically connected to the respective external terminals 1210a to 1210d via respective circuit layers of the connection unit 1200. In this way, the semiconductor units 1300a to 1300d are electrically connected in parallel.

Figure 4:
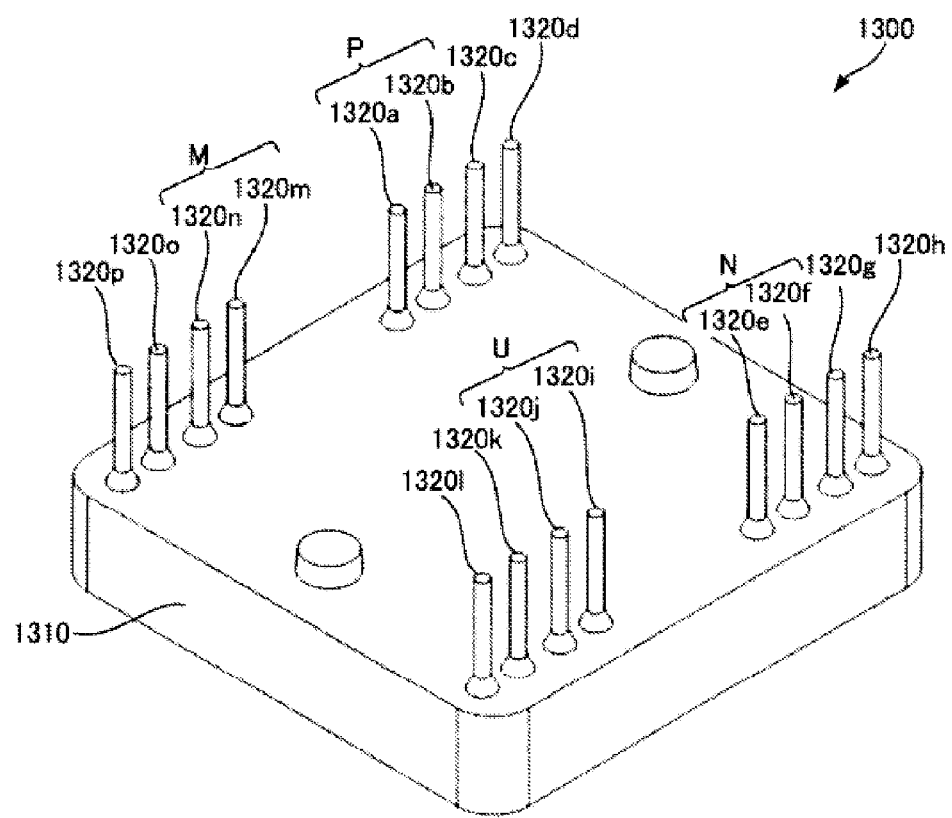
FIG. 4 is a perspective view showing the exterior of a semiconductor unit equipped in a semiconductor device according to Embodiment 2.

Next, the semiconductor units 1300a to 1300d housed in the semiconductor device 1000 is described using FIG. 4. Below, the semiconductor units 1300a to 1300d are collectively referred to as a semiconductor unit 1300. Primary terminals and control terminals equipped on the semiconductor unit 1300 will also be collectively referred to as connection terminals.

FIG. 4 is a perspective view showing the exterior of a semiconductor unit equipped in a semiconductor device according to Embodiment 2. The semiconductor unit 1300 is molded using a resin 1310 made of a thermosetting resin, and connection terminals 1320a to 1320p protrude out from the resin 1310.

The primary terminals 1320a and 1320b correspond to the P terminal, the primary terminals 1320e and 1320f to the N terminal, the primary terminals 1320m and 1320n to the M terminal, which is at an intermediate potential, and the primary terminals 1320i and 1320j to the U terminal that outputs to a load (not shown).

Although FIG. 4 shows an example in which the single semiconductor unit 1300 is molded using the resin 1310, it is not necessary to mold the semiconductor unit 1300 using the resin 1310. Similar to a common power semiconductor module, the unit may be sealed with a gel after all parts are electrically and mechanically connected, for example. However, compared to a common gel-sealing method, molding using the resin 1310 not only increases the breakdown voltage but also improves other properties such as power-cycle and heat-cycle resistance. If the single semiconductor unit 1300 is molded by a resin, a procedure involved in assembling multiple units becomes easier because problems such as damage due to entry of foreign matter into the units can be prevented.

Figure 5A:
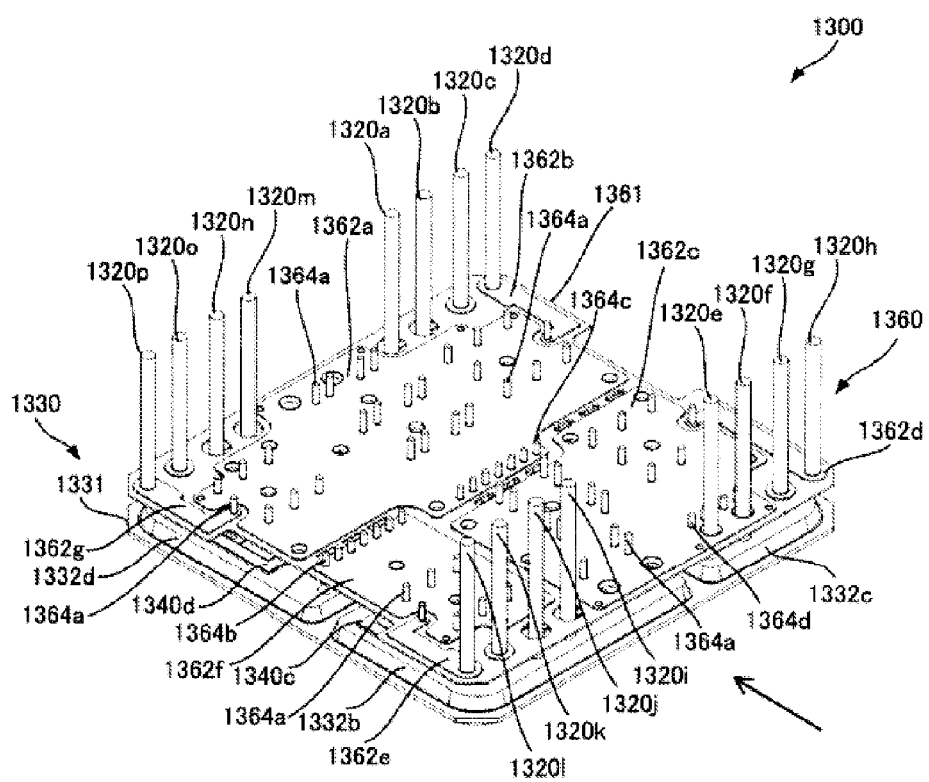
FIGS. 5A and 5B are views showing a semiconductor unit equipped in a semiconductor device according to Embodiment 2.
Figure 5B:
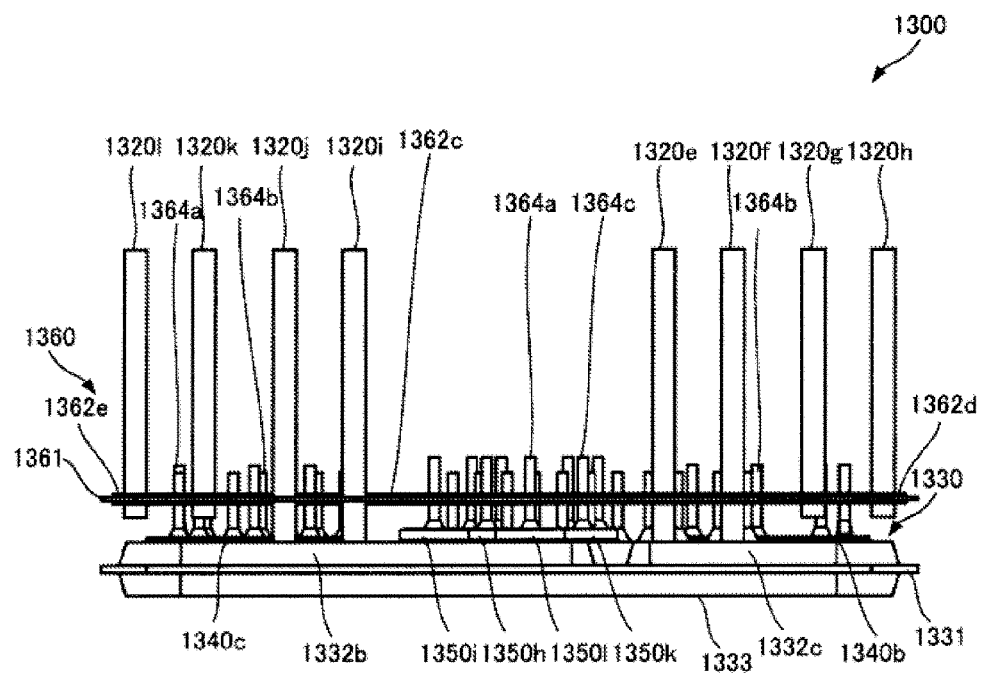

Now, the internal configuration sealed by the resin 1310 of the semiconductor unit 1300 is described using FIGS. 5A and 5B. FIGS. 5A and 5B are views showing a semiconductor unit equipped in a semiconductor device according to Embodiment 2.

FIG. 5A is a perspective view of a semiconductor unit. FIG. 5B is a side view of FIG. 5A from the direction of the arrow. The semiconductor unit 1300 includes a multi-layer substrate 1330, a plurality of semiconductor elements 1340a to 1340d, and wiring members including a printed circuit board 1360 and a plurality of conductive posts 1364a to 1364d.

The printed circuit board 1360 includes a resin layer 1361 made of a planar-shaped resin and conductive circuit layers 1362a to 1362g placed on the front surface of the resin layer 1361 in FIGS. 5A and 5B.

The printed circuit board 1360 also includes a plurality of conductive posts 1364a to 1364d protruding out to both the front and back side of the printed circuit board 1360. The plurality of conductive posts 1364a to 1364d and the corresponding circuit layers 1362a to 1362g on the front surface are electrically connected.

Furthermore, the conductive post 1364a is electrically connected to primary electrodes or gate electrodes of one of the semiconductor elements 1340a to 1340d or diodes 1350a to 1350l. The conductive post 1364b is electrically connected to a circuit board 1332d of the multi-layer substrate 1330. The conductive post 1364c is electrically connected to a circuit board 1332b of the multi-layer substrate 1330. The conductive post 1364d is electrically connected to a circuit board 1332c of the multi-layer substrate 1330. The details of the conductive posts 1364a to 1364d are described later.

Furthermore, control terminals 1320c, 1320d, 1320g, 1320h, 1320k, 1320l, 1320o, and 1320p are disposed on the printed circuit board 1360. The control terminals 1320d, 1320h, 1320l, and 1320p are also electrically connected to the circuit layers 1362b, 1362d, 1362e, and 1362g, respectively. The control terminals 1320d, 1320h, 1320l, and 1320p are electrically connected to the corresponding gate electrode of each of the semiconductor elements 1340a to 1340d via the corresponding circuit layers and the conductive post 1364a.

Also the control terminals 1320c, 1320g, 1320k, and 1320o are electrically connected to the corresponding emitter electrodes of each of the semiconductor elements 1340a to 1340d. In other words, the control terminals 1320c, 1320g, 1320k, and 1320o detect emitter current output from the semiconductor elements 1340a to 1340d. Using the detected emitter current, the control terminals can function as sense emitter terminals detecting excess current.

One end of each of the primary terminals 1320a and 1320b is fixed and electrically connected to a circuit board 1332a (described later) of the multi-layer substrate 1330. One end of each of the primary terminals 1320e and 1320f is fixed and electrically connected to a circuit board 1332c of the multi-layer substrate 1330. One end of each of the primary terminals 1320i and 1320j is fixed and electrically connected to a circuit board 1332b of the multi-layer substrate 1330. One end of each of the primary terminals 1320m and 1320n is fixed and electrically connected to a circuit board 1332d of the multi-layer substrate 1330. The other end of each of the primary terminals 1320a, 1320b, 1320e, 1320f, 1320i, 1320j, 1320m, and 1320n also goes through through-holes in the printed circuit board 1360 and protrudes in the same direction.

Figure 6A:
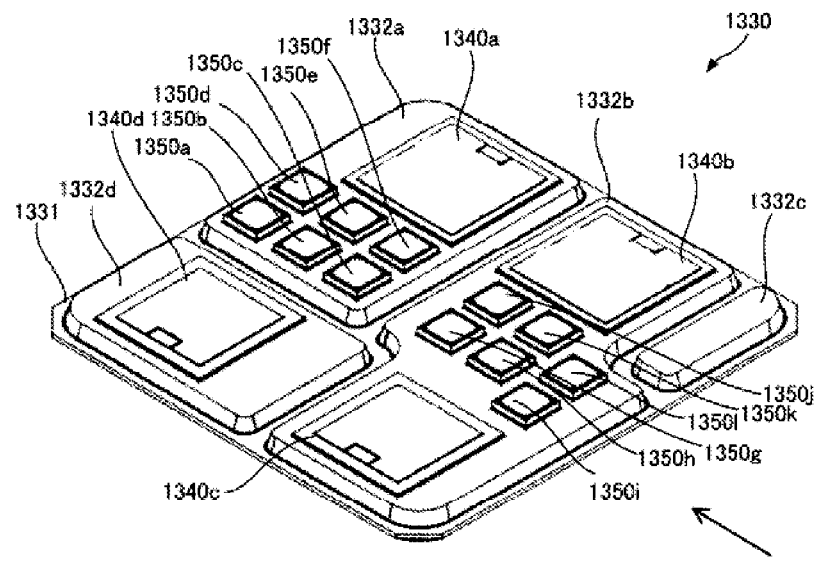
FIGS. 6A and 6B are views showing a multi-layer substrate, semiconductor elements, and diodes of a semiconductor unit equipped in a semiconductor device according to Embodiment 2.
Figure 6B:
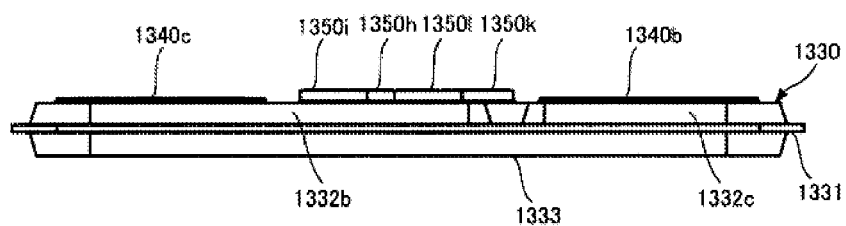

Next, the multi-layer substrate 1330 equipped on the semiconductor unit 1300 is described using FIGS. 6A and 6B. FIGS. 6A and 6B are figures showing a multi-layer substrate, semiconductor elements, and diodes of a semiconductor unit equipped in a semiconductor device according to Embodiment 2.

FIG. 6A is a perspective view of a multi-layer substrate of a semiconductor unit. FIG. 6B is a side view of FIG. 6A from the direction of the arrow. The multi-layer substrate 1330 includes an insulating plate 1331 made of ceramic or the like and circuit plates 1332a to 1332d. The circuit plates 1332a to 1332d are disposed on the primary surface (the front surface) of the insulating plate 1331. The multi-layer substrate 1330 also includes a metal plate 1333 on the surface of the insulating plate 1331 opposite from the primary surface (the back surface) thereof.

The 0 1332a to 1332d are made of conductive material, electrically insulated from one another, and disposed on the primary surface of the insulating plate 1331. A DCB substrate or AMB substrate can be used for the multi-layer substrate 1330, for example.

Out of these circuit plates, the circuit plates 1332a and 1332b include the semiconductor elements 1340a and 1340b, which are IGBTs. The circuit plates 1332b and 1332d include the semiconductor elements 1340c and 1340d, which are reverse-blocking IGBTs. The collector electrodes on the back side of the semiconductor elements 1340a to 1340d are electrically connected to the circuit plates 1332a, 1332b, and 1332d with a conductive bonding material.

Furthermore, the diodes 1350a to 1350l, which are SBDs, are disposed on the circuit plates 1332a and 1332b. The cathode electrodes on the back side of the diodes 1350a to 1350l are electrically connected to the circuit plates 1332a and 1332b with a conductive bonding material.

As shown in FIGS. 5A and 5B, the semiconductor unit 1300 is formed by setting the printed circuit board 1360 on the multi-layer substrate 1330 as described. Where the conductive posts 1364a to 1364d connect to the multi-layer substrate 1330 in this case is described using FIGS. 5A to 8.

Figure 7:
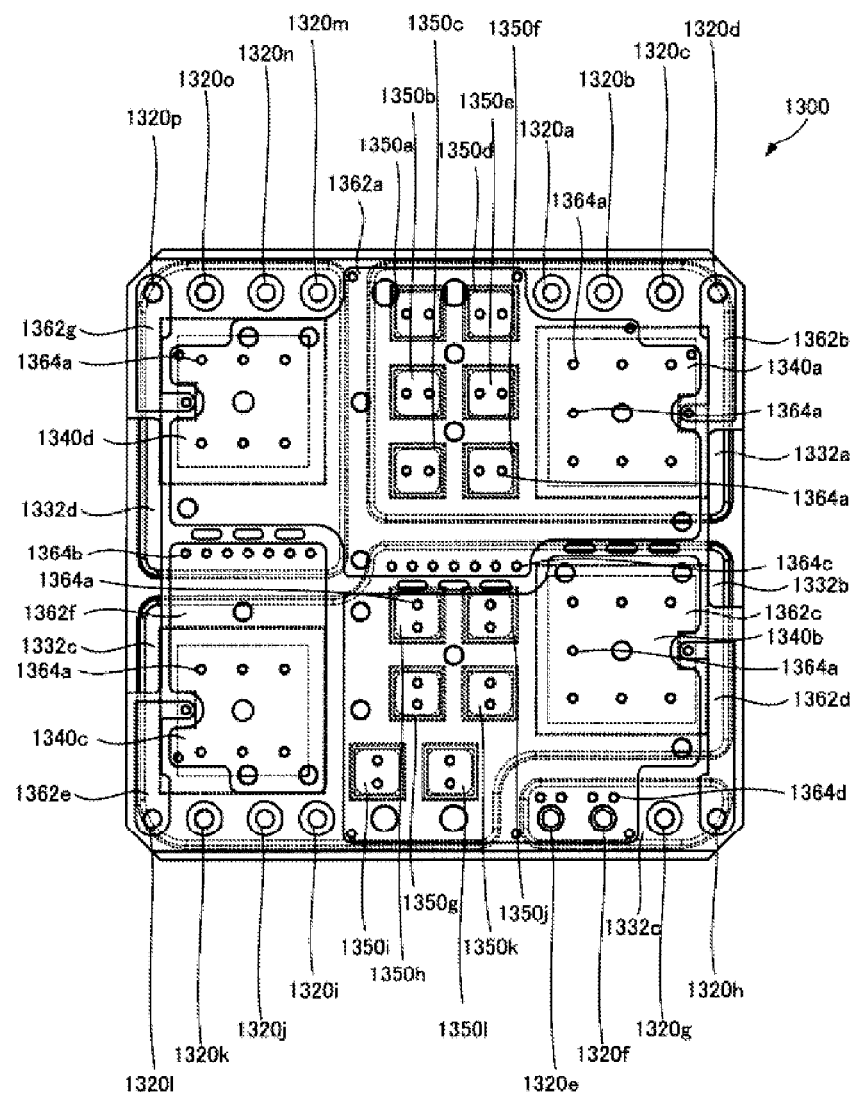
FIG. 7 is a view showing where conductive posts connect to a multi-layer substrate of a semiconductor unit equipped in a semiconductor device according to Embodiment 2.

FIG. 7 is a view showing where conductive posts are connected to a multi-layer substrate of a semiconductor unit equipped in a semiconductor device according to Embodiment 2. FIG. 7 is a top view of the semiconductor unit 1300 shown in FIGS. 5A and 5B, and a configuration of the multi-layer substrate 1330 is shown using dotted lines.

Figure 8:
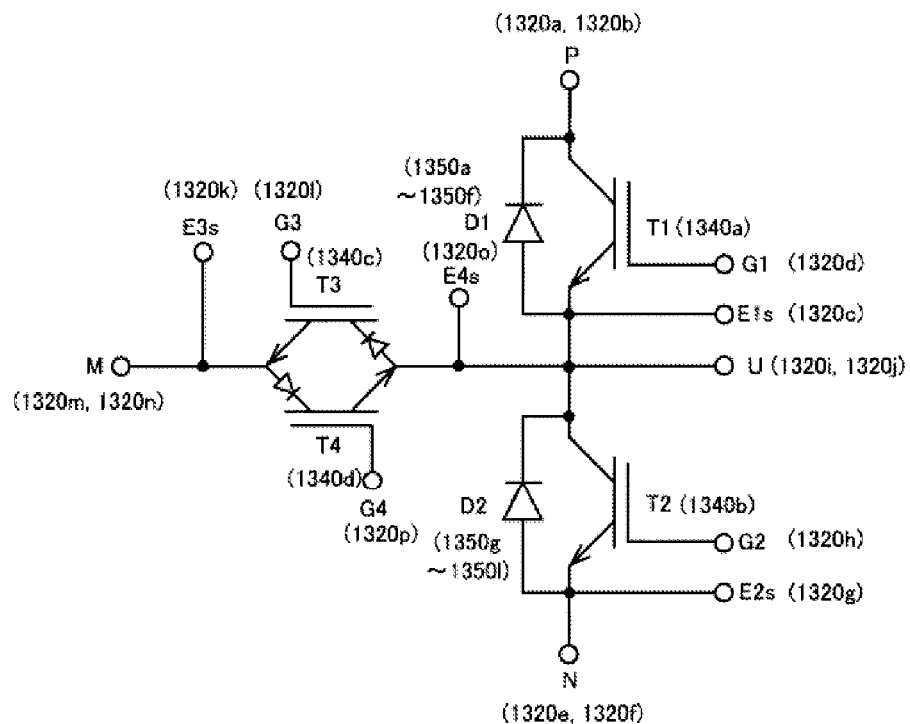
FIG. 8 is a circuit diagram showing a circuit configuration formed in a semiconductor unit equipped in a semiconductor device according to Embodiment 2.

FIG. 8 is a circuit diagram showing a circuit configuration formed in a semiconductor unit equipped in a semiconductor device according to Embodiment 2. The plurality of conductive posts 1364a are electrically connected to the electrodes on the front surfaces of the semiconductor elements 1340a to 1340d and the diodes 1350a to 1350l. Specifically, the conductive posts 1364a are electrically connected to the primary electrodes (emitter electrodes) and the gate electrode of each of the semiconductor elements 1340a to 1340d. The conductive posts 1364a are also electrically connected to the anode electrode of each of the diodes 1350a to 1350l.

The control terminal 1320*d* is also electrically connected to the gate electrode of the semiconductor element 1340*a* via the circuit layer 1362*b* of the printed circuit board 1360 and the conductive posts 1364*a*. When the gate voltage is applied to the control terminal 1320*d* in accordance with an external control signal, the gate voltage is applied to the gate electrode of the semiconductor element 1340*a*, thereby switching the state of the semiconductor element 1340*a* from an OFF-state (non-conductive state) to an ON-state (conductive state).

The control terminal 1320*h* is connected to the gate electrode of the semiconductor element 1340*b* via the circuit layer 1362*d* of the printed circuit board 1360 and the conductive posts 1364*a*. When the gate voltage is applied to the control terminal 1320*h* in accordance with an external control signal, the gate voltage is applied to the gate electrode of the semiconductor element 1340*b*, thereby switching the state of the semiconductor element 1340*b* from an OFF-state to an ON-state.

The control terminal 1320*l* is electrically connected to the gate electrode of the semiconductor element 1340*c* via the circuit layer 1362*e* of the printed circuit board 1360 and the conductive posts 1364*a*. When the gate voltage is applied to the control terminal 1320*l* according to an external control signal, the gate voltage is applied to the gate electrode of the semiconductor element 1340*c*, thereby switching the state of the semiconductor element 1340*c* from an OFF-state to an ON-state.

The control terminal 1320*p* is electrically connected to the gate electrode of the semiconductor element 1340*d* via the circuit layer 1362*g* of the printed circuit board 1360 and the conductive posts 1364*a*. When the gate voltage is applied to the control terminal 1320*p* in accordance with an external control signal, the gate voltage is applied to the gate electrode of the semiconductor element 1340*d*, thereby switching the state of the semiconductor element 1340*d* from an OFF-state to an ON-state.

The plurality of conductive posts 1364*b* are electrically connected to the circuit board 1332*d* of the multi-layer substrate 1330. In other words, the conductive posts 1364*b* electrically connect the circuit layer 1362*f* of the printed circuit board 1360 to the circuit board 1332*d* of the multi-layer substrate 1330.

The plurality of conductive posts 1364*c* are electrically connected to the circuit board 1332*b* of the multi-layer substrate 1330. In other words, the conductive posts 1364*c* electrically connect the circuit layer 1362*a* of the printed circuit board 1360 to the circuit board 1332*b* of the multi-layer substrate 1330.

The conductive posts 1364*d* are electrically connected to the circuit board 1332*c* of the multi-layer substrate 1330. In other words, the conductive posts 1364*d* electrically connect the circuit layer 1362*c* of the printed circuit board 1360 to the circuit board 1332*c* of the multi-layer substrate 1330.

In this way, inside the semiconductor unit 1300, a three-level inverter circuit shown in FIG. 8 is formed by the multi-layer substrate 1330, the semiconductor elements 1340*a* to 1340*d*, the printed circuit board 1360, and the conductive posts 1364*a* to 1364*d*.

The primary terminals 1320*a* and 1320*b*, each of which is the P terminal, are connected to a high potential terminal of an external power source, and the primary terminals 1320*e* and 1320*f*, each of which is the N terminal, are connected to a low potential terminal of an external power source. The primary terminals 1320*m* and 1320*n*, each of which is the M terminal, are connected to an intermediate potential terminal of an external power source. The primary terminals 1320*i* and 1320*j*, each of which is an output terminal (the U terminal) of the semiconductor unit 1300, are connected to a load (not shown in the figure). In this configuration, the semiconductor unit 1300 functions as a three-level inverter.

Typically, in a three-level inverter, when the polarity of an inverter output voltage is positive, T1 and T3 are alternately switched between ON and OFF, T4 is always turned ON, and T2 is always turned OFF. In contrast, when the polarity of an inverter output voltage is negative, T2 and T4 are alternately switched ON and OFF, T3 is always turned ON, and T1 is always turned OFF.

Now, an input voltage from an external power source is applied to the collector electrode of the semiconductor element 1340*a* via the primary terminals 1320*a* and 1320*b*, each of which is the P terminal, via the circuit board 1332*a* of the multi-layer substrate 1330. When the voltage polarity of desired output is positive, an ON signal is sent to T1, for example. Then, the emitter electrodes on the front surface of the semiconductor element 1340*a* generate an output current.

The current outputted from the emitter electrodes of the semiconductor element 1340*a* (T1) flows into the circuit layer 1362*a* of the printed circuit board 1360 via the conductive posts 1364*a* connected to the emitter electrodes. The output current further flows into the circuit board 1332*b* of the multi-layer substrate 1330 from the conductive posts 1364*c* and flows out from the primary terminals 1320*i* and 1320*j*, each of which is the U terminal.

A mid-point potential from an external power source is applied to the collector electrode of the semiconductor element 1340*d* via the primary terminals 1320*m* and 1320*n*, each of which is the M terminal, via the circuit board 1332*d* of the multi-layer substrate 1330. When the semiconductor element 1340*a* (T1) is turned OFF, the output current flows into the semiconductor element 1340*d* (T4) in an ON-state and flows out from the emitter electrodes on the front surface of the semiconductor element 1340*d*.

The current outputted from the emitter electrodes of the semiconductor element 1340 *d* (T1) flows into the circuit layer 1362*a* of the printed circuit board 1360 via the conductive posts 1364*a* connected to the emitter electrodes. The output current further flows into the circuit board 1332*b* of the multi-layer substrate 1330 from the conductive posts 1364*c* and flows out from the primary terminals 1320*i* and 1320*j*, each of which is a U terminal.

The collector electrode of the semiconductor element 1340*b* is connected to a load via the primary terminals 1320*i* and 1320*j*, each of which is a U terminal, and the circuit board 1332*b* of the multi-layer substrate 1330. When the voltage polarity outputted by the inverter is negative, by turning the semiconductor element 1340*b* (T2) ON, the emitter electrodes on the front surface of the semiconductor element 1340*b* generate a current.

The current outputted from the emitter electrodes of the semiconductor element 1340*b* (T2) flows into the circuit layer 1362*c* of the printed circuit board 1360 via the conductive posts 1364*a* connected to the emitter electrodes. The outputted current further flows into the circuit board 1332*c* of the multi-layer substrate 1330 from the conductive post 1364*d* and flows out from the primary terminals 1320*e* and 1320*f*, each of which is the N terminal.

The collector electrode of the semiconductor element 1340*c* (T3) is connected to a load via the primary terminals 1320*i* and 1320*j*, each of which is a U terminal, and the circuit board 1332*b* of the multi-layer substrate 1330. When the semiconductor element 1340*b* (T2) is turned OFF, the output current flows into the semiconductor element 1340*c* in an ON-state.

The current outputted from the emitter electrodes of the semiconductor element 1340*c* (T3) flows into the circuit layer 1362*f* of the printed circuit board 1360 via the conductive posts 1364*a* connected to the emitter electrodes. The outputted current further flows into the circuit board 1332*d* of the multi-layer substrate 1330 from the conductive post 1364*b* and flows out from the primary terminals 1320*m* and 1320*n*, each of which is the M terminal.

The semiconductor unit 1300 can efficiently transform direct-current power input from an external power source into alternating-current power by appropriately controlling the operations described above. As shown in FIGS. 2A to 3, the connection unit 1200 is used to electrically connect the semiconductor device 1000 to the plurality of semiconductor units 1300 in parallel. Here, the external terminal 1210*a* of the connection unit 1200 is connected to a high potential terminal of an external power source, the external terminal 1210*c* to a low potential terminal, and the external terminal 1210*b* to an intermediate potential of an external power source. In this configuration, the primary terminals 1320*a* and 1320*b*, each of which is the P terminal of the semiconductor units 1300*a* to 1300*d*, and the external terminal 1210*a* acquire the same potential. The primary terminals 1320*e* and 1320*f*, each of which is the N terminal of the semiconductor units 1300*a* to 1300*d*, and the external terminal 1210*c* acquire the same potential. Furthermore, the primary terminals 1320*n* and 1320*m*, each of which is the M terminal of the semiconductor units 1300*a* to 1300*d*, and the external terminal 1210*b* acquire the same potential. Moreover, the outputted current from the primary terminals 1320*i* and 1320*j*, each of which is the U terminal of the semiconductor units 1300*a* to 1300*d*, combine and flow out from the external terminal 1210*d* of the connection unit 1200. The control terminals 1320*c*, 1320*d*, 1320*g*, 1320*h*, 1320*k*, 1320*l*, 1320*o*, 1320*p* of each of the semiconductor units 1300*a* to 1300*d* are connected in parallel by the circuit layers formed on the connection unit 1200 in a manner similar to above. Each of the control terminals 1320*c*, 1320*d*, 1320*g*, 1320*h*, 1320*k*, 1320*l*, 1320*o*, 1320*p* connected in parallel are electrically connected to a plurality of external control terminals 1220 equipped on the semiconductor device 1000.

Compared to the conventional technology, this configuration can lower the inductance of the wiring in the semiconductor device 1000. As a specific example, a configuration similar to the three-level inverter module described in Patent Document 1 (the total inductance inside the device excluding the external terminals and the like is about 30 nH) is described. First, if the semiconductor device 1000 according to Embodiment 2 is constructed in the same size as this conventional module, the internal inductance of a single semiconductor unit 1300 can be about 20 nH. Next, because four semiconductor units are connected in parallel, the overall inductance of the four semiconductor units 1300 is about 5 nH (=20 nH/4). On the other hand, the inductance of the connection unit 1200 is about 10 nH. In other words, because the internal inductance of the semiconductor device 1000 can be about 15 nH (=5 nH+10 nH), the inductance inside the device can be significantly lowered compared to the conventional technology.

Furthermore, in the semiconductor unit 1300, this configuration can lower the inductance between the semiconductor elements 1340*a* to 1340*d*, particularly between the P terminal and the M terminal and between the M terminal and the N terminal.

The lowering of the inductance helped improve the efficiency of the three-level inverter module. Furthermore, because the conductive layer for wiring on the multi-layer substrate 1330 becomes unnecessary, the semiconductor unit 1300 can be made compact. As a result, in the semiconductor device 1000, it became possible to allow for a larger volume of current and improve the efficiency of the inverter simultaneously.

Furthermore, in the semiconductor device 1000, simply by providing the number of the semiconductor units 1300 needed for rated capacity and the connection unit 1200 for each rated capacity, it is possible to allow for a greater volume of current. Thus, it is also possible to lower the manufacturing cost of three-level inverter modules.

In addition, in the present embodiment, from each of the semiconductor units 1300, the plurality of connection terminals 1320*a* to 1320*p* protrude in the same direction. In this arrangement, the process of electrically connecting each semiconductor unit 1300 in parallel only involves inserting each of the connection terminals into the connection holes in the connection unit 1200 from one direction. Thus, the manufacturing cost of three-level inverter modules can be lowered even further.

In Embodiment 2, although a case in which IGBTs are used as semiconductor elements is described, the semiconductor elements are not limited to IGBTs, and power MOSFETs can also be used, for example. When a power MOSFET is used as a semiconductor element, the primary electrodes of the front surface described above becomes the source electrodes, and the collector electrode on the back surface becomes the drain electrodes.

In other words, within the scope of the present specification and claims, the electrodes on the positive side of semiconductor elements, which are switching elements, are collectively referred to as "collector electrodes" and the electrodes on the negative side of semiconductor elements, which are switching elements, are collectively referred to as "emitter electrodes."

In Embodiment 2, a semiconductor element can not only be a silicon (Si) semiconductor element but also a wide-bandgap semiconductor element such as a silicon carbide (SiC) semiconductor element or a gallium nitride (GaN) semiconductor element. Compared with a Si semiconductor element, a wide-bandgap semiconductor element is capable of high-speed switching, which can reduce loss. Furthermore, because high-speed switching can increase carrier frequency, components such as coils and capacitors equipped in an inverter module can be made more compact. As a result, an inverter module can be made more compact, and the cost of making an inverter module can be lowered. On the other hand, when high-speed switching is performed, the inductance of the wiring introduces adverse effects such as an abrupt increase of voltage. However, in Embodiment 2, because the inductance of the wiring is lowered, efficient high-speed switching becomes possible.

Embodiment 3

Embodiments 1 and 2 described an example in which wiring members for semiconductor elements and diodes inside a semiconductor unit (hereafter these components may be collectively referred to as a "semiconductor chip") included a plurality of conductive posts and a printed circuit board. Embodiment 3 describes, using FIG. 9, a case in which wiring members for a semiconductor chip inside a semiconductor unit placed on a multi-layer substrate include a plurality of wires.

Figure 9:
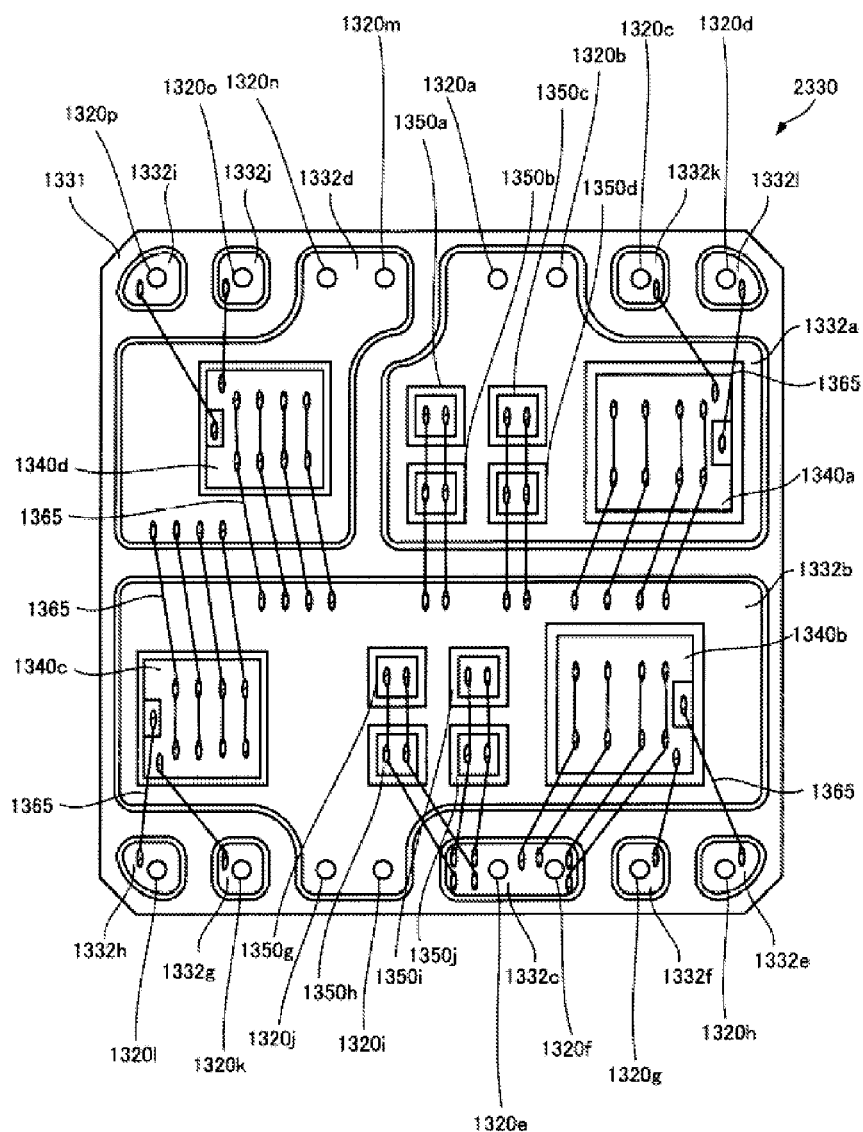
FIG. 9 is a view showing a multi-layer substrate of a semiconductor unit included in a semiconductor device according to Embodiment 3.

FIG. 9 is a view showing a multi-layer substrate when wiring members according to Embodiment 3 include a plurality of wires. A multi-layer substrate 2330 has the same configuration as a multi-layer substrate 1330 according to Embodiment 2. Specifically, the multi-layer substrate 2330 includes an insulating plate 1331 made of material such as ceramic, circuit plates 1332a to 1332d, and circuit plates 1332e to 1332l. The circuit plates 1332a to 1332l are disposed on the primary surface (the front surface) of the insulating plate 1331. The multi-layer substrate 2330 also includes a metal plate (not shown) on the surface opposite from the primary surface (the back surface) of the insulating plate 1331.

The circuit plates 1332a to 1332l are made of conductive material, electrically insulated from one another, and disposed on the primary surface of the insulating plate 1331. A DCB substrate or AMB substrate can be used for the multi-layer substrate 2330, for example.

Out of these circuit plates, the circuit plates 1332a and 1332b include the semiconductor elements 1340a and 1340b, which are IGBTs. The circuit plates 1332b and 1332d include the semiconductor elements 1340c and 1340d, which are reverse-blocking IGBTs. The collector electrodes on the back side of each of the semiconductor elements 1340a to 1340d are electrically connected to the circuit plates 1332a, 1332b, and 1332d with conductive bonding material. In addition, primary terminals 1320a, 1320b, 1320i, 1320j, 1320n, and 1320m are disposed on circuit plates 1332a, 1332b, and 1332d. The primary terminals 1320a, 1320b, 1320i, 1320j, 1320n, and 1320m are also electrically connected to the circuit plates 1332a, 1332b, and 1332d with conductive bonding material.

Furthermore, the diodes 1350a to 1350d and 1350g to 1350j, which are SBDs, are disposed on the circuit plates 1332a and 1332b. The cathode electrodes on the back surface of each of the diodes 1350a to 1350d and 1350g to 1350j are electrically connected to the circuit plates 1332a and 1332b with conductive bonding material.

Furthermore, the primary terminals 1320e and 1320f and the control terminals 1320h, 1320g, 1320k, 1320l, 1320p, 1320o, 1320c, and 1320d are disposed on the circuit plates 1332c and 1332e to 1332l. The primary terminals 1320e and 1320f and the control terminals 1320h, 1320g, 1320k, 1320l, 1320p, 1320o, 1320c, and 1320d are also electrically connected to the circuit plates 1332c and 1332e to 1332l with conductive bonding material.

The semiconductor elements 1340a to 1340d and the diodes 1350a to 1350d and 1350g to 1350j are electrically connected by wires 1365. Specifically, the gate electrode of the semiconductor element 1340a and the circuit board 1332l are connected by one of the wires 1365, and the emitter electrodes of the semiconductor element 1340a and the circuit plates 1332b and 1332k are connected by the wires 1365. The gate electrode of the semiconductor element 1340b and the circuit board 1332e are connected by one of the wires 1365, and the emitter electrodes of the semiconductor element 1340b and the circuit plates 1332c and 1332f are connected by the wires 1365. The gate electrode of the semiconductor element 1340c and the circuit board 1332h are connected by one of the wires 1365, and the emitter electrodes of the semiconductor element 1340c and the circuit plates 1332d and 1332g are connected by the wires 1365. The gate electrode of the semiconductor element 1340d and the circuit board 1332i are connected by one of the wires 1365, and the emitter electrodes of the semiconductor element 1340d and the circuit plates 1332b and 1332j are connected by the wires 1365. Furthermore, the anode electrodes of the diodes 1350a to 1350d are connected to the circuit board 1332b by the wires 1365. The anode electrodes of the diodes 1350g to 1350j are connected to the circuit board 1332c by the wires 1365.

In a manner similar to Embodiment 2, the multi-layered substrate 2330 configured as described is molded by a resin made of a thermosetting resin, and the connection terminals 1320a to 1320p protrude out from the resin 1310 forming a semiconductor unit.

In such a semiconductor unit, the primary terminals 1320a and 1320b, each of which is a P terminal, are connected to a high potential terminal of an external power source, and the primary terminals 1320e and 1320f, each of which is an N terminal, are connected to a low potential terminal of an external power source. The primary terminals 1320m and 1320n, each of which is an M terminal, are also connected to an intermediate potential terminal of an external power source. The primary terminals 1320i and 1320j, each of which is an output terminal (U terminal) of the semiconductor unit, are connected to a load (not shown). As a result, in a manner similar to the semiconductor unit 1300 according to Embodiment 2, the semiconductor unit functions as a three-level inverter.

Embodiment 4

Figure 10A:
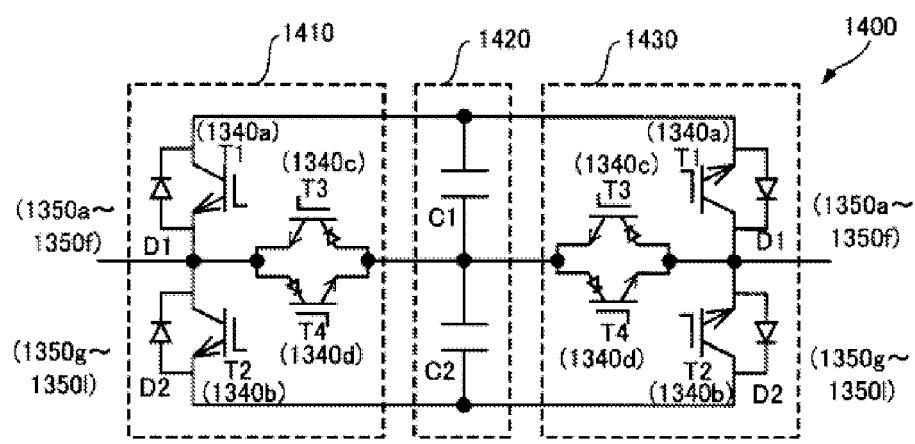
FIGS. 10A to 10C are circuit diagrams respectively showing a circuit configuration forming a power conversion system.
Figure 10B:
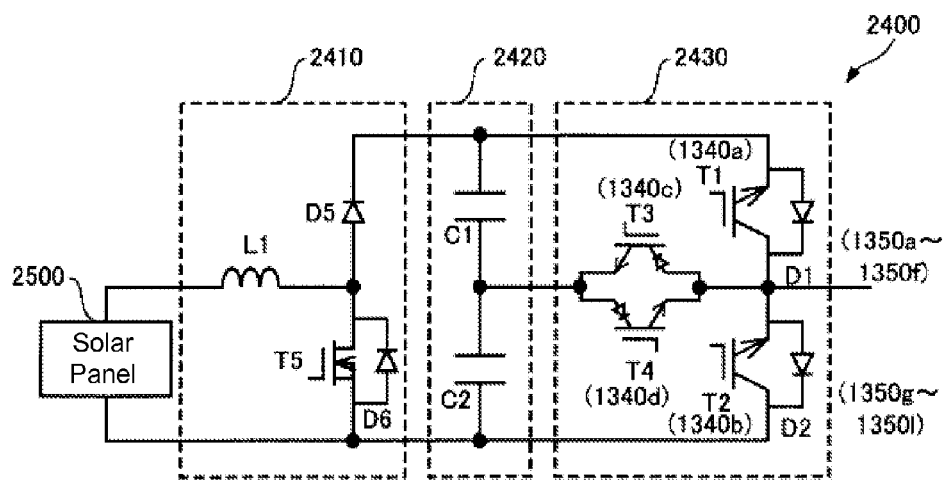
Figure 10C:
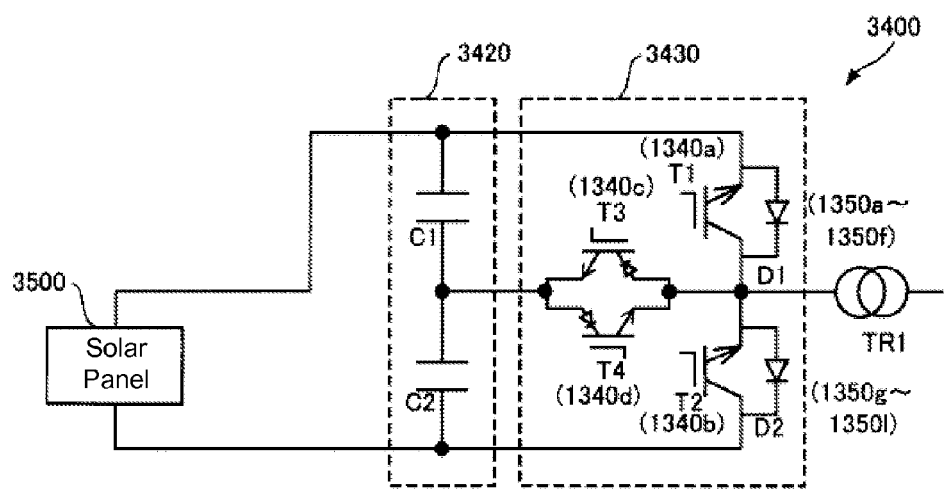

First, various power conversion systems formed by a semiconductor device are described using FIGS. 10A to 10C.

Embodiment 4 and following embodiments are described using a case in which a semiconductor unit 1300 according to Embodiment 2 is used. However, the present embodiment is not limited to this example Like Embodiment 3, an example in which wires are used as wiring members can also be used.

FIGS. 10A to 10C are circuit diagrams respectively showing a circuit configuration forming a power conversion system. FIG. 10A shows a uninterruptible power supply 1400, and FIGS. 10B and 10C respectively show inverter devices for solar energy 2400 and 3400.

As shown in FIG. 10A, the uninterruptible power supply 1400 includes a PWM (Pulse Width Modulation) converter 1410, a direct current power supply 1420, and a PWM inverter 1430.

For the PWM converter 1410, a semiconductor device 1000 that includes the semiconductor unit 1300 wired to form a converter circuit is used. The PWM converter 1410 is made of three arms. The PWM converter 1410 includes an arm (upper arm), in which a semiconductor element T1 (1340a) and a diode D1 (1350a to 1350f) are connected in parallel, and another arm (lower arm), in which a semiconductor element T2 (1340b) and a diode D2 (1350g to 1350l) are connected in parallel. Furthermore, the PWM converter 1410 includes an arm (middle arm), in which semiconductor elements T3 and T4 (1340c and 1340d) are connected in anti-parallel.

In the direct current power supply 1420, capacitors C1 and C2 are connected in series. For the PWM inverter 1430, a semiconductor device 1000 that includes the semiconductor unit 1300 wired to form an inverter circuit is used. In a manner similar to the PWM converter 1410, the PWM inverter 1430 is also made of three arms. The PWM inverter 1430 includes an arm (upper arm), in which a semiconductor element T1 (1340a) and a diode D1 (1350a to 1350f) are connected in parallel, and another arm (lower arm), in which a semiconductor element T2 (1340b) and a diode D2 (1350g to 1350l) are connected in parallel. Furthermore, the PWM converter 1430 includes an arm (middle arm), in which semiconductor elements T3 and T4 (1340c and 1340d) are connected in anti-parallel.

In the uninterruptible power supply 1400, when a commercial power supply is plugged into the PWM converter 1410, the direct current once controlled by the PWM converter 1410 is rectified, and the current flows into the direct current power supply 1420. Then, the direct current from the direct current power supply 1420 is once again converted back into an alternating current by the PWM inverter 1430 supplying power to a load.

As shown in FIG. 10B, the inverter device for solar energy 2400 includes a boost chopper 2410, a direct current power supply 2420, and a PWM inverter 2430. After receiving sunlight, a solar panel 2500 generates power and outputs a current (direct current).

The boost chopper 2410 increases and stabilizes the output voltage from the solar panel 2500. The boost chopper 2410 includes an inductor L1, a diode D5, a semiconductor element T5 such as a power MOSFET, and a diode D6 connected in parallel to the semiconductor element T5.

In the inverter device for solar energy 2400, the voltage generated by the solar panel 2500 receiving sunlight is stabilized by the boost chopper 2410, rectified, and input into the direct current power supply 2420. Then, the direct current from the direct current power supply 2420 is once again inverted back into an alternating current by the PWM inverter 2430 supplying power to a load.

The inverter device for solar energy 2400 is often used in a low-voltage system for household use and the like. An inverter device for solar energy 3400 is to be used in a large-scale system such as a solar farm. Because the voltage of the systems working together is high, the inverter device for solar energy 3400 is not equipped with the boost chopper 2410 as is the inverter device 2400. As shown in FIG. 10C, similar to the inverter device 2400, the inverter device for solar energy 3400 includes a direct current power supply 3420, a PWM inverter 3430, and a step-up transformer TR1.

In the inverter device for solar energy 3400, the direct current generated and output by the solar panel 3500 receiving sunlight is rectified and input into the direct current power supply 3420. Then, the PWM inverter 3430 inverts the direct current from the direct current power supply 3420 into an alternating current. Then, the step-up transformer TR1 transforms the voltage to a desired level and provides power to a load.

Next, losses occurring in each semiconductor chip in each semiconductor device forming a power conversion system are described using FIGS. 11A to 11C. FIG. 11A shows the losses that occur in the PWM inverter 1430 of the uninterruptible power supply 1400 and each semiconductor chip in the PWM inverter 2430 of the inverter device 2400. FIG. 11B shows the losses that occur in each semiconductor chip in the PWM converter 1410 of the uninterruptible power supply 1400. FIG. 11C shows the losses that occur in each semiconductor chip in the PWM inverter 3430 of the inverter device 3400. The losses that occur in each semiconductor chip include conduction losses that occur when a current flows, and switching losses that occur during ON-OFF operation and reverse recovery. In FIGS. 11A to 11C, the same output current and switching frequency are used, and the losses in each semiconductor device are normalized by setting the total sum of all losses as 100%.

As shown in FIG. 11A, in the PWM inverter 1430 and PWM inverter 2430, out of three kinds of semiconductor chips, the losses in the IGBTs of the upper and lower arms (the semiconductor elements T1 and T2) are greatest, and the loss in the FWDs of the upper and lower arms (the diodes D1 and D2) is smallest. Because the PWM inverter 1430 typically has a high-power factor of 0.9 to 1.0, the conduction rate of the FWDs of the upper and lower arms and the reverse-blocking IGBTs of the middle arm is small. For this reason, the main source of loss is the IGBTs in the upper and lower arms.

As shown in FIG. 11B, in the PWM converter 1410, out of three kinds of semiconductor chips, the losses in the FWDs of the upper and lower arms (the diodes D1 and D2) are greater than the losses in the reverse-blocking IGBTs of the middle arm (the semiconductor elements T3 and T4), and the losses in the IGBTs of the upper and lower arms (the semiconductor elements T1 and T2) are close to zero. In the PWM converter 1410, the voltage is increased by the FWDs of the upper and lower arms and the reverse-blocking IGBT of the middle arm. For this reason, the losses in the FWDs of the upper and lower arms and the reverse-blocking IGBTs of the middle arm become dominant.

As shown in FIG. 11C, in the PWM inverter 3430 of the inverter device 3400, out of three kinds of semiconductor chips, the losses in the IGBTs of the upper and lower arms (the semiconductor elements T1 and T2) and the reverse-blocking IGBTs of the middle arm (the semiconductor elements T3 and T4) are greater than the losses in the FWDs of the upper and lower arms (the diodes D1 and D2). In the PWM inverter 3430, the conduction rate of the IGBTs of the upper and lower arms (the semiconductor elements T1 and T2) decreases, and the conduction rate of the reverse-blocking IGBTs of the middle arm (the semiconductor elements T3 and T4) increases. For this reason, in the PWM inverter 3430, the loss ratio of the reverse-blocking IGBT of the middle arm becomes greater than that of the PWM inverter 1430.

FIGS. 11A to 11C demonstrate that in semiconductor devices according to Embodiments 1 to 3, the losses occurring in each semiconductor chip in the semiconductor units differ depending on purpose and operating parameters. In semiconductor devices according to Embodiments 1 to 3, when a plurality of semiconductor units are placed in a prescribed location, depending on the location and operation condition of each semiconductor chip, only some of the semiconductor chips become heated, and the heat generated by the semiconductor devices can vary. When the heat generated by the semiconductor devices varies, there is a risk that the portion of the semiconductor devices where the generated heat is concentrated becomes hotter.

To address this problem, a plurality of semiconductor units are arranged to control the variation of heat generated by the semiconductor devices in accordance with factors such as the purpose and operation conditions of the semiconductor devices. Below, a case in which a semiconductor device is used as the PWM inverter 1430 (or the PWM inverter 2430) is described using FIG. 12 (corresponds to FIG. 11A).

Figure 12:
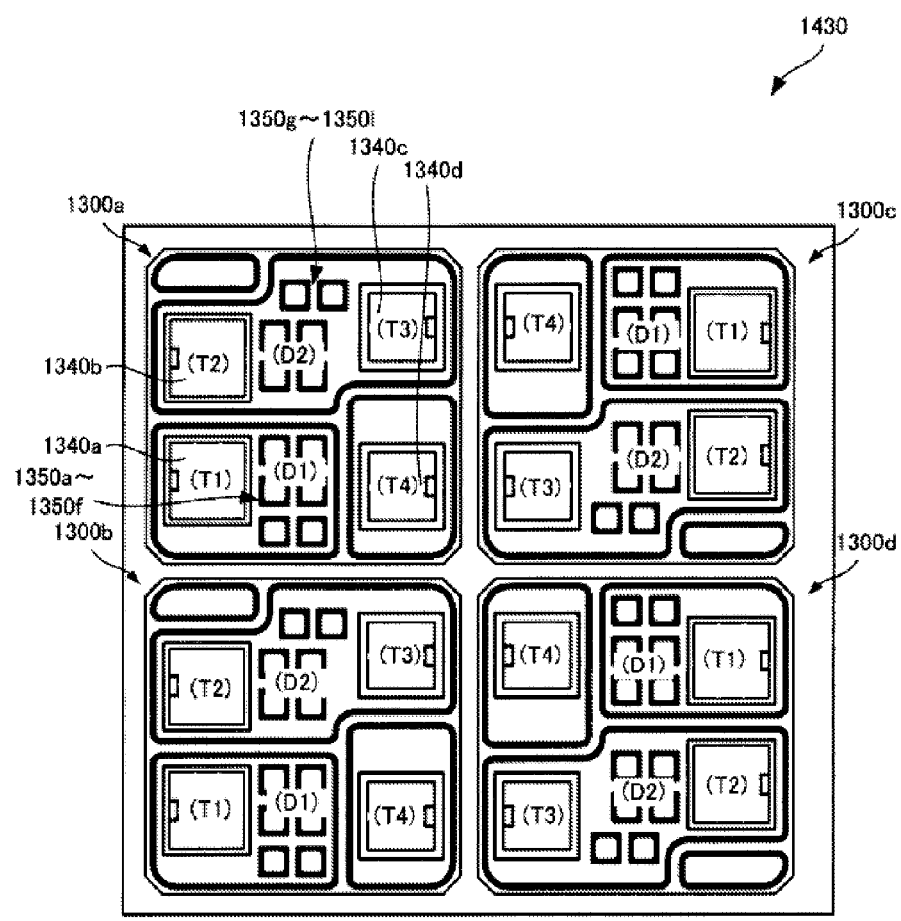
FIG. 12 is a view showing a PWM inverter according to Embodiment 4.

FIG. 12 is a top view showing the arrangement of each semiconductor unit in the PWM inverter 1430 according to Embodiment 4. In the PWM inverter 1430, four of the semiconductor units 1300a to 1300d according to Embodiment 2 are arranged, for example. FIG. 12 shows only the semiconductor chips (semiconductor elements and diodes) arranged on the semiconductor units 1300a to 1300d. Reference characters are given only to the semiconductor chips of the semiconductor unit 1300a and omitted for the other semiconductor units 1300b to 1300d.

As shown in FIG. 11A, in the PWM inverter 1430, the losses in IGBTs of the upper and lower arms (the semiconductor elements T1 and T2) are greatest followed by the losses in the reverse-blocking IGBTs of the middle arm (the semiconductor elements T3 and T4). For this reason, in the PWM inverter 1430, the heat generated in the IGBTs of the upper and lower arms (the semiconductor elements T1 and T2) is greatest followed by the heat generated in the reverse-blocking IGBTs of the middle arm (the semiconductor elements T3 and T4).

The semiconductor units 1300a to 1300d are arranged such that the semiconductor elements T1 and T2 are on the outer side, and the semiconductor elements T3 and T4 on the inner side of the PWM inverter 1430. Specifically, in the semiconductor units 1300a and 1300b, the semiconductor elements T1 and T2 are arranged on the left side of the figure (the outer side), and the semiconductor elements T3 and T4 are arranged on the right side of the figure (the inner side). In the semiconductor units 1300c and 1300d, the semiconductor elements T1 and T2 are arranged on the right side of the figure (the outer side), and the semiconductor elements T3 and T4 are arranged on the left side of the figure (the inner side).

In the PWM inverter 1430 of the present embodiment, the semiconductor elements T1 and T2 generating a large amount of heat are arranged on the outer side of the PWM inverter 1430 by turning the semiconductor units 1300a to 1300d. In this arrangement, the places in the PWM inverter 1430 where heat is generated are spread out, and the increase in temperature in the PWM inverter 1430 is controlled. Thus, the PWM inverter 1430 with greater reliability can be achieved.

Embodiment 5

Figure 13:
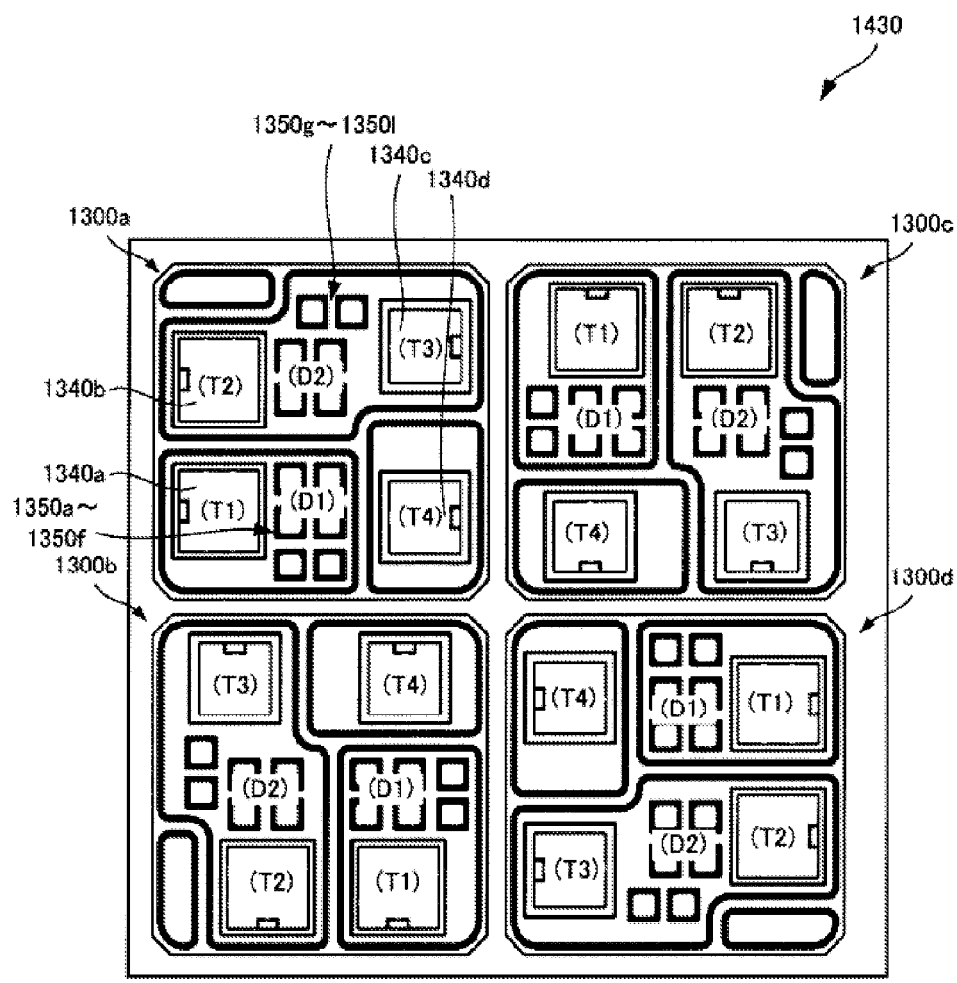
FIG. 13 is a view showing a PWM inverter according to Embodiment 5.

Using FIG. 13, Embodiment 5 describes an example in which a semiconductor device is used as a PWM inverter 1430 and semiconductor units 1300a to 1300d are arranged differently from Embodiment 4.

FIG. 13 is a top view showing the arrangement of each semiconductor unit in the PWM inverter 1430 according to Embodiment 5. In the PWM inverter 1430 according to Embodiment 5, four of the semiconductor units 1300a to 1300d are arranged in a manner similar to Embodiment 4, for example. In the PWM inverter 1430 according to Embodiment 5, the semiconductor units 1300b and 1300c of the PWM inverter 1430 according to Embodiment 4 are rotated 90 degrees in the counter-clockwise direction in the figure.

The arrangement in Embodiment 5 prevents the semiconductor elements T1 and T2 from being next to one another between the semiconductor units 1300a to 1300d, because the semiconductor units 1300a to 1300d are rotated 90 degrees. In this arrangement, the places in the PWM inverter 1430 where heat is generated are further spread out, and the PWM inverter 1430 with greater reliability is achieved.

Embodiment 6

Figure 14:
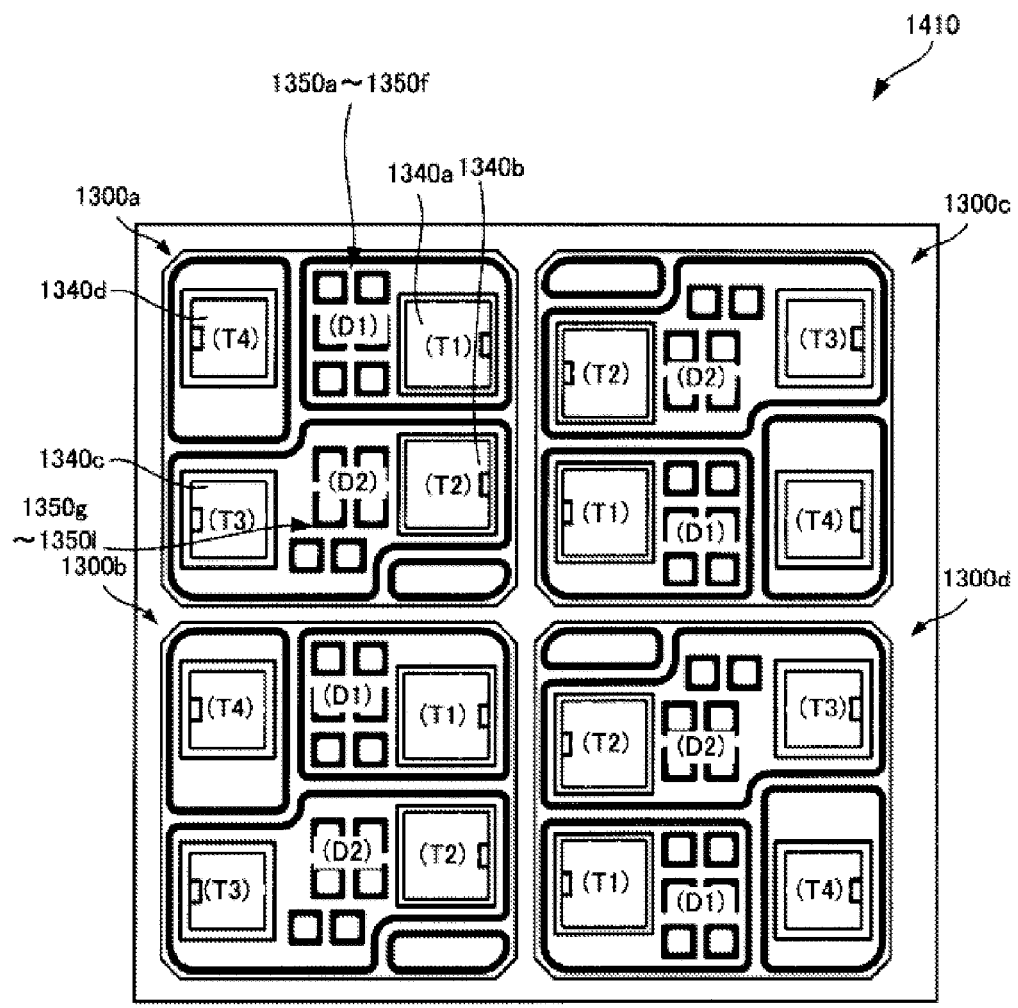
FIG. 14 is a view showing a PWM converter according to Embodiment 6.

Embodiment 6 describes, using FIG. 14, a case in which a semiconductor device is used as a PWM converter 1410 of a uninterruptible power supply 1400.

FIG. 14 is a top view showing the arrangement of each semiconductor unit in the PWM converter 1410 according to Embodiment 6. In the PWM converter 1410, four of the semiconductor units 1300a to 1300d according to Embodiment 2 are arranged, for example.

As shown in FIG. 11B, in the PWM converter 1410, the losses in the FWDs of the upper and lower arms (diodes D1 and D2) and the reverse-blocking IGBTs of the middle arm (semiconductor elements T3 and T4) are large. The losses in the IGBTs of the upper and lower arms (the semiconductor elements T1 and T2) are close to zero. For this reason, in the PWM converter 1410, the heat generated in the FWDs of the upper and lower arms (the diodes D1 and D2) and the reverse-blocking IGBTs of the middle arm (the semiconductor elements T3 and T4) is large, and the heat generated in the IGBTs of the upper and lower arms (the semiconductor elements T1 and T2) is close to zero.

Here, the semiconductor units 1300a to 1300d are arranged such that the diodes D1 and D2 and the semiconductor elements T3 and T4 are on the outer side, and the semiconductor elements T1 and T2 on the inner side of the PWM converter 1410 of the present embodiment.

Specifically, in the semiconductor units 1300a and 1300b, the semiconductor elements T3 and T4 and the diodes D1 and D2 are arranged on the left side (the outer side) of the figure, the semiconductor elements T1 and T2 are arranged on the right side (the inner side) of the figure. In the semiconductor units 1300c and 1300d, the semiconductor elements T3 and T4 and the diodes D1 and D2 are arranged on the right side (the outer side) of the figure, and the semiconductor elements T1 and T2 are arranged on the left side (the inner side) of the figure.

In the PWM converter 1410 of the present embodiment, the diodes D1 and D2 and the semiconductor elements T3 and T4 generating a large amount of heat are arranged on the outer side of the PWM converter 1410 by rotating the semiconductor units 1300a to 1300d. In this arrangement, the places in the PWM converter 1410 where heat is generated are spread out, and the increase in temperature of the PWM converter 1410 is controlled. Thus, the PWM converter 1410 with greater reliability can be achieved.

It should be mentioned that, in the PWM converter 1410 according to Embodiment 6, the semiconductor units 1300b and 1300c can be rotated 90 degrees in the counter-clockwise direction in the figure in a manner similar to the PWM inverter 1430 according to Embodiment 5.

As shown in FIG. 11C, in the PWM inverter 3430 of the inverter device 3400, the losses in the reverse-blocking IGBTs of the middle arm (the semiconductor elements T3 and T4) and the IGBTs of the upper and lower arms (the semiconductor elements T1 and T2) are greater than the losses in the FWDs in the upper and lower arms (the diodes D1 and D2). For this reason, by arranging the semiconductor units 1300a to 1300d of the PWM inverter 3430 as shown in FIG. 14, the increase in temperature can be controlled.

Embodiment 7

Figure 15:
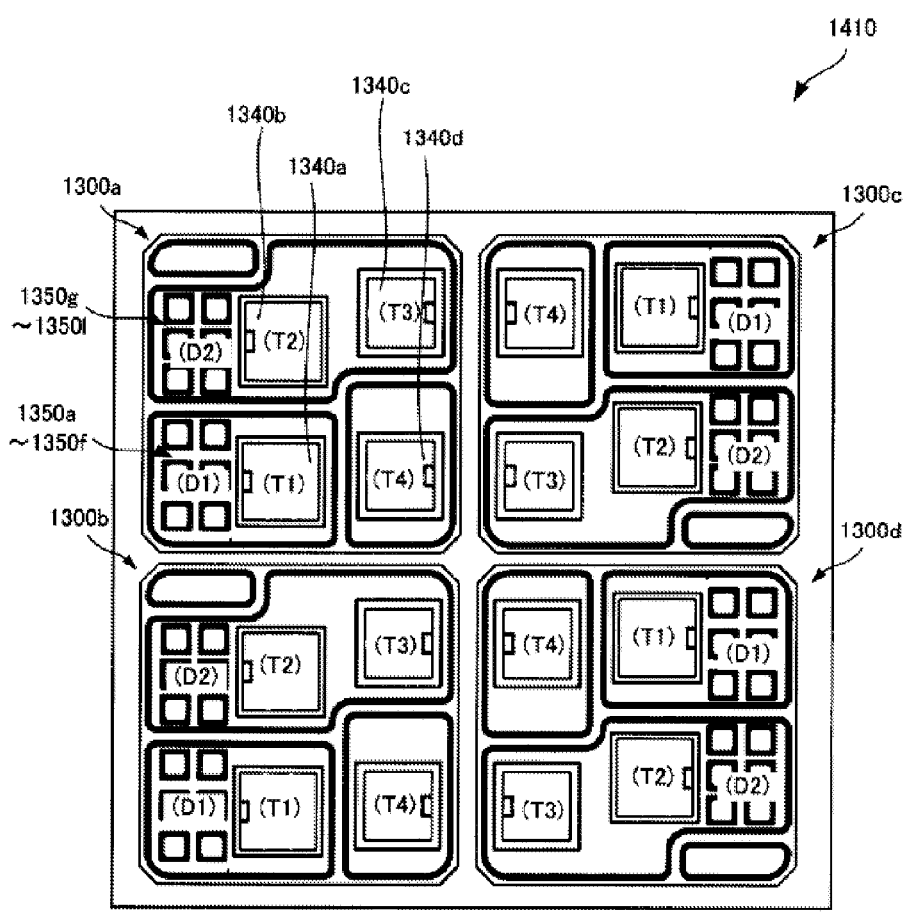
FIG. 15 is a view showing a PWM converter according to Embodiment 7.

Embodiment 7 describes, using FIG. 15, a case in which a semiconductor device is used as a PWM converter 1410 and each semiconductor chip of the semiconductor units 1300a to 1300d is arranged differently from Embodiment 6.

FIG. 15 is a top view showing the arrangement of each semiconductor unit in the PWM converter 1410 according to Embodiment 7. In the PWM converter 1410 according to Embodiment 7, four of the semiconductor units 1300a to 1300d according to Embodiment 2 are arranged, for example. FIG. 15 shows only the semiconductor chips (semiconductor elements and diodes) arranged on the semiconductor units 1300a to 1300d. Reference characters are given only to the semiconductor chips of the semiconductor unit 1300a and omitted for the other semiconductor units 1300b to 1300d.

As described above, from FIG. 11B, in the PWM converter 1410 of a uninterruptible power supply 1400, it can be inferred that the heat generated in the FWDs of the upper and lower arms (diodes D1 and D2) is greater than the heat generated in the reverse-blocking IGBTs of the middle arm (semiconductor elements T3 and T4) and that the heat generated in the IGBTs of the upper and lower arms (semiconductor elements T1 and T2) is close to zero.

Here, in the PWM converter 1410 according to Embodiment 7, the arrangement of the diodes D1 and D2 and the semiconductor elements T1 and T2 in the semiconductor units 1300a to 1300d are swapped respectively. Furthermore, the semiconductor units 1300a to 1300d are arranged such that the diodes D1 and D2 are on the outer side and the semiconductor elements T3 and T4 are on the inner side.

Specifically, in the semiconductor units 1300a and 1300b in which the arrangement of the diodes D1 and D2 and the semiconductor elements T1 and T2 are swapped respectively, the diodes D1 and D2 are arranged on the left side (outer side) of the figure, the semiconductor elements T3 and T4 on the right side (inner side) of the figure. In the semiconductor units 1300c and 1300d in which the arrangement of the diodes D1 and D2 and the semiconductor elements T1 and T2 are swapped respectively, the diodes D1 and D2 are arranged on the right side (outer side) of the figure, the semiconductor elements T3 and T4 on the left side (inner side) of the figure.

In the PWM converter 1410 of the present embodiment, in a manner similar to Embodiment 6, the semiconductor units 1300a to 1300d are rotated so that the diodes D1 and D2 generating more heat than the semiconductor elements T3 and T4 are arranged on the outer side of the PWM converter 1410. In this arrangement, the places in the PWM converter 1410 where heat is generated are spread out, and the increase in temperature of the PWM converter 1410 is controlled. In this way, the PWM converter with greater reliability can be achieved.

Each Embodiment 1 to 7 is one example, and the present invention is not limited thereto. Although two semiconductor units were used to describe Embodiment 1, and four semiconductor units were used to describe Embodiments 2 to 7, the number of semiconductor units can be three or five or more, for example.

Furthermore, not all semiconductor units need to have the same internal structure, and the internal structure may have a structure of axial or point symmetry. Moreover, a semiconductor element mounted on a semiconductor unit is not limited to one chip per arm and can connect a plurality of chips in parallel to increase capacity.

In addition, a component such as a lead frame can be used for the wiring members of a semiconductor unit, for example. One semiconductor unit may include a plurality of multi-layer substrates.

It should be noted that, in Embodiments 1 to 7, a case in which reverse-blocking IGBTs having a reverse breakdown voltage are used as the middle arm is described, but a bidirectional switch, which is made by connecting normal IGBTs and FWDs in anti-parallel and further connecting them in anti-series, can also be used for a middle arm.

Also, although the semiconductor device forms a single-phase bridge connection structure, it can embed a three-phase structure or a structure with more than three phases. It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device for use in a single phase U of a three-phase inverter, comprising:
   a plurality of semiconductor units, each of the semiconductor units being a separate three-level inverter circuit of a single-phase bride connection having a plurality of terminals that includes a P terminal, an M terminal, an N terminal, and a U terminal of the single-phase bridge connection; and
   a connection unit electrically connecting the plurality of semiconductor units in parallel,
   wherein each of said semiconductor units includes:
      a multi-layer substrate including an insulating plate and circuit plates disposed on a primary surface of said insulating plate;
      a plurality of semiconductor elements each having a back surface thereof fixed to one of said circuit plates and a front surface thereof having primary electrodes; and
      wiring members electrically connected to the primary electrodes of said semiconductor elements, and
   wherein in each of said semiconductor units, said multi-layer substrate, the plurality of semiconductor elements, and said wiring members are configured in such a way as to constitute said separate three-level inverter circuit of the single-phase bridge connection,
   wherein the plurality of semiconductor units are disposed side-by-side on a same plane, and
   wherein said connection unit is disposed above the plurality of semiconductor units and has a plurality of external terminals that include a P terminal, a M terminal, an N terminal, and a U terminal on a top surface thereof, each of the P, M, N and U terminals on the top surface connecting corresponding ones of the P, M, N, and U terminals of the three-level inverter circuits, respectively, in parallel.

2. The semiconductor device according to claim 1, wherein said wiring members include a printed circuit board arranged facing towards the primary surface of said insulating plate of said multi-layer substrate, and a plurality of conductive posts electrically connecting said printed circuit board to at least some of said primary electrodes of each of said semiconductor elements.

3. The semiconductor device according to claim 2,
   wherein each of said semiconductor units further comprises a plurality of primary terminal posts, as at least some of the plurality of terminals of the three-inverter circuit, each having a bottom end thereof fixed to one of said circuit plates of said multi-layer substrate and another end thereof protruding in a same direction through a through-hole in said printed circuit board, and
   wherein said another end of each of the plurality of primary terminal posts is inserted into said connection unit thereby electrically connecting said plurality of semiconductor units in parallel via said connection unit.

4. The semiconductor device according to claim 2, wherein said connection unit is a bus bar or a printed circuit board differing from said printed circuit board of said wiring members.

5. The semiconductor device according to claim 2, wherein said semiconductor elements, said printed circuit board, and said conductive posts are sealed in each of said semiconductor units with a thermosetting resin.

6. The semiconductor device according to claim 1, further comprising a case that houses the plurality of semiconductor units.

7. The semiconductor device according to claim 1, wherein each of said semiconductor elements has on a back surface a collector electrode electrically connected to said circuit plate.

8. The semiconductor device according to claim 1, wherein said wiring members include a plurality of wires electrically connected to said primary electrodes of said semiconductor elements.

9. The semiconductor device according to claim 1, wherein said semiconductor units are arranged according to losses during an operation of said the semiconductor device in the respective semiconductor units such that said semiconductor elements that generate heat are spatially dispersed.

10. The semiconductor device according to claim 9, wherein said semiconductor units are arranged such that said semiconductor elements at which said losses are greatest are on an outer side of said semiconductor device.

11. The semiconductor device according to claim 9, wherein in each of the semiconductor units, said semiconductor elements are arranged such that said semiconductor elements in the plurality of semiconductor units that generate heat are disposed on an outer side of the semiconductor device.

* * * * *